US012795982B2

(12) United States Patent
Jain et al.

(10) Patent No.: US 12,795,982 B2
(45) Date of Patent: Nov. 10, 2026

(54) MULTI-FIN FIN-TYPE FIELD EFFECT TRANSISTOR WITH FINE-TUNED EFFECTIVE CHANNEL WIDTH

(71) Applicant: GlobalFoundries U.S. Inc., Malta, NY (US)

(72) Inventors: Navneet K. Jain, Milpitas, CA (US); David Charles Pritchard, Schenectady, NY (US); Romain H.A. Feuillette, Williston, VT (US); James P. Mazza, Saratoga Springs, NY (US); Hong Yu, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 792 days.

(21) Appl. No.: 18/301,382

(22) Filed: Apr. 17, 2023

(65) Prior Publication Data

US 2024/0347638 A1 Oct. 17, 2024

(51) Int. Cl.
*H10D 30/62* (2025.01)
*H10D 30/01* (2025.01)
(Continued)

(52) U.S. Cl.
CPC ....... *H10D 30/6211* (2025.01); *H10D 30/024* (2025.01); *H10D 62/292* (2025.01);
(Continued)

(58) Field of Classification Search
CPC ............. H10D 84/0158; H10D 84/834; H10D 84/0151; H10D 84/0188; H10D 84/0135;
(Continued)

(56) References Cited

U.S. PATENT DOCUMENTS 7,859,044 B2 12/2010 Wong et al.
8,658,539 B2 * 2/2014 Chang .................. H10D 30/024 438/585

(Continued)

FOREIGN PATENT DOCUMENTS

EP 3324436 B1 8/2020

OTHER PUBLICATIONS

U.S. Appl. No. 18/354,114, Notice of Allowance dated Feb. 25, 2026, 8 pages.

(Continued)

*Primary Examiner* — Tuan A Hoang
(74) *Attorney, Agent, or Firm* — Francois Pagette; Hoffman Warnick LLC

(57) ABSTRACT

Disclosed are a structure including a fin-type field effect transistor (FINFET) and a method. The FINFET includes first and second fins. An isolation structure is adjacent the outer sidewall of the first fin at a channel region and, optionally, fills a groove in the outer sidewall so the fin width is reduced. A gate is adjacent the inner sidewall of the first fin at the channel region and extends over the first fin to the isolation structure. The gate is further adjacent an inner sidewall and top of the second fin at a channel region. In some embodiments, a second isolation structure is adjacent an outer sidewall of the second fin at the channel region and, optionally, fills a groove in the outer sidewall so the fin width is reduced. In this case, the gate extends over the second fin to the second isolation structure.

19 Claims, 19 Drawing Sheets

$W_{eff}=2*h+2*w_r$ (e.g., where $w_r \sim \frac{1}{2}$ w)

(51) Int. Cl.

| | |
|---|---|
| ***H10D 62/17*** | (2025.01) |
| ***H10D 64/01*** | (2025.01) |
| ***H10D 64/66*** | (2025.01) |
| ***H10D 84/01*** | (2025.01) |

(52) U.S. Cl.

CPC ..... *H10D 64/01326* (2026.01); *H10D 64/017* (2025.01); *H10D 64/671* (2025.01); *H10D 84/0128* (2025.01); *H10D 84/0135* (2025.01); *H10D 84/0151* (2025.01); *H10D 84/0188* (2025.01)

(58) Field of Classification Search

CPC ........... H10D 84/0128; H10D 30/6211; H10D 30/024; H10D 62/292

See application file for complete search history.

(56) References Cited

U.S. PATENT DOCUMENTS

| | | | | |
|---|---|---|---|---|
| 10,199,378 | B2 | 2/2019 | Jain et al. | |
| 10,423,078 | B1 | 9/2019 | Shen et al. | |
| 10,615,265 | B2 | 4/2020 | Ghani et al. | |
| 2014/0203376 | A1 * | 7/2014 | Xie | H10W 10/014 438/424 |
| 2018/0061976 | A1 | 3/2018 | Zang et al. | |
| 2018/0261514 | A1 | 9/2018 | Xie et al. | |
| 2019/0067115 | A1 | 2/2019 | Park et al. | |
| 2020/0135580 | A1 * | 4/2020 | Hsieh | H10D 84/0151 |
| 2021/0082766 | A1 * | 3/2021 | Miura | H01J 37/32082 |
| 2024/0136254 | A1 | 4/2024 | Kang et al. | |

OTHER PUBLICATIONS

U.S. Appl. No. 18/354,114, Amendment to Office Action filed Jan. 14, 2026, 16 pages.

U.S. Appl. No. 18/354,114, Office Action dated Nov. 5, 2025, 12 pages.

Liu, "Imec Demonstrates Excellent Performance of Si FinFET CMOS devices with Integrated Tungsten Buried Power Rails," Press Release, 2020 Symposia on VLSI Technology and Circuits, IMEC, Jun. 15, 2020, 18 pages.

Huang et al., "Integration Challenges of TSV Backside Via Reveal Process," IEEE Electronic Components & Technology Conference, 2013, downloaded on Jun. 1, 2023 from IEEE Xplore, pp. 915-917.

Jourdain et al., "Buried Power Rails and Nano-Scale TSV: Technology Boosters for Backside Power Delivery Network and 3D Heterogeneous Integration," IEEE 72nd Electronic Components and Technology Conference (ECTC), 2022, pp. 1531-1538.

Wen, "The Other Side of the Wafer: The Latest Developments in Backside Power Delivery," retrieved from: https://www.coventor.com/blog/latest-developments-backside-power-delivery/ on Jun. 1, 2023, Published on Dec. 19, 2022, 4 pages.

U.S. Appl. No. 18/354,114, Application as filed Jul. 18, 2023, 60 pages.

Fenouillet-Beranger, "Advanced planar FDSOI devices," CEA Leti innovation for industry, Paris, Jul. 16, 2014, 63 pages.

Raaijmakers, ASML reduces DUV overlay error to 1 nanometer,' Bits & Chips, Apr. 7, 2021, retrieved from: https://bits-chips.nl/artikel/asml-reduces-duv-overlay-error-to-1-nanometer/ on Dec. 2, 2022, 13 pages.

Fronheiser et al., "Impact of Aggressive Fin Width Scaling on FinFET Device Characteristics," IEEE 2017, 4 pages.

* cited by examiner

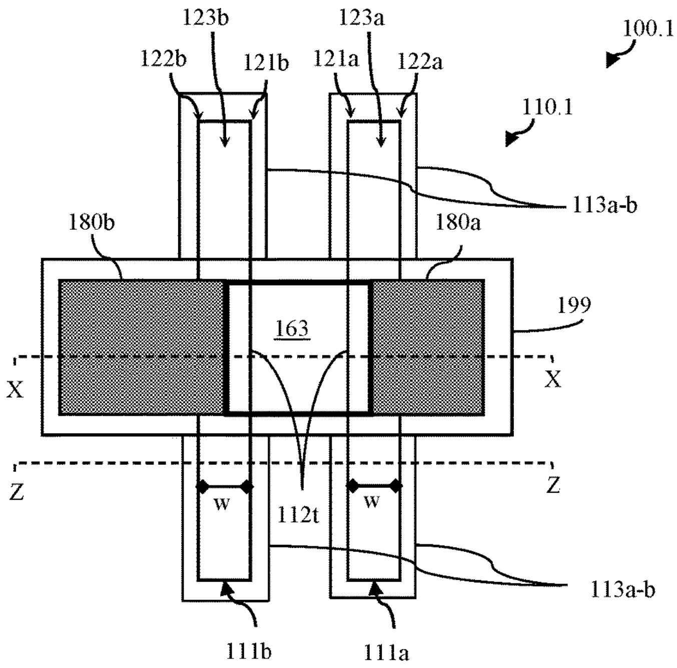
FIG. 1.1A
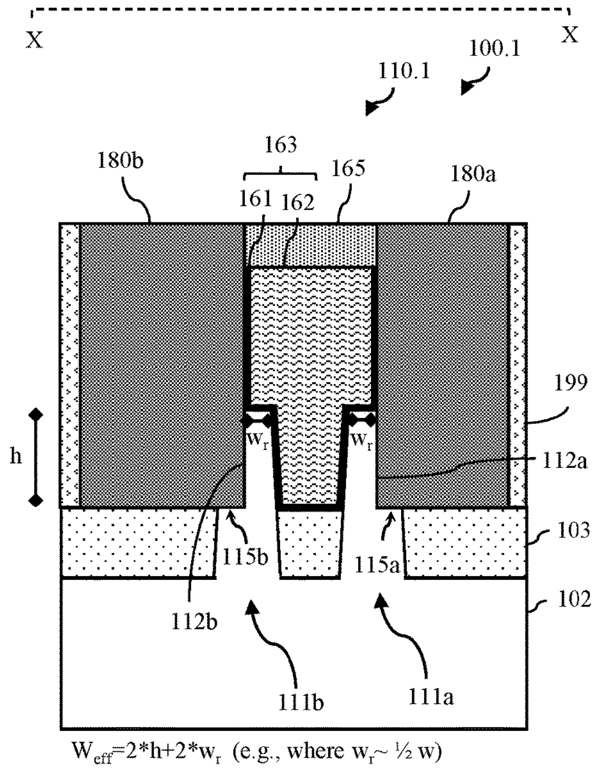
FIG. 1.1B
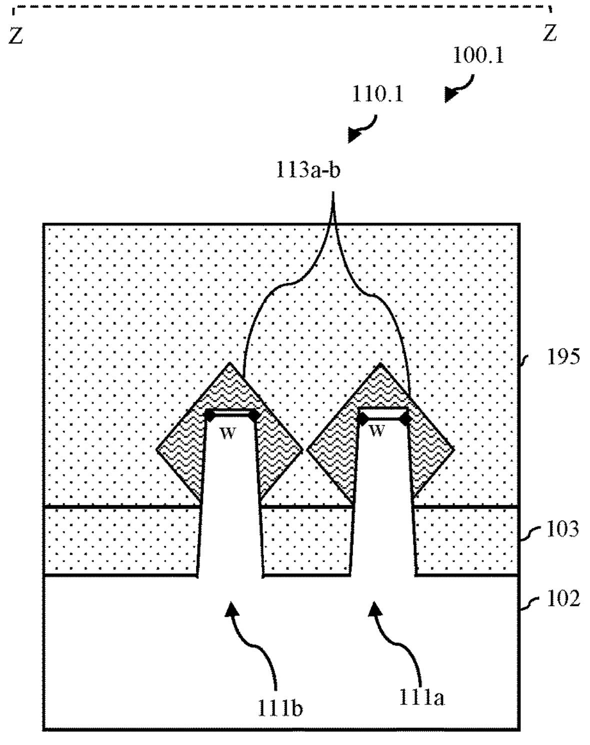
FIG. 1.1C

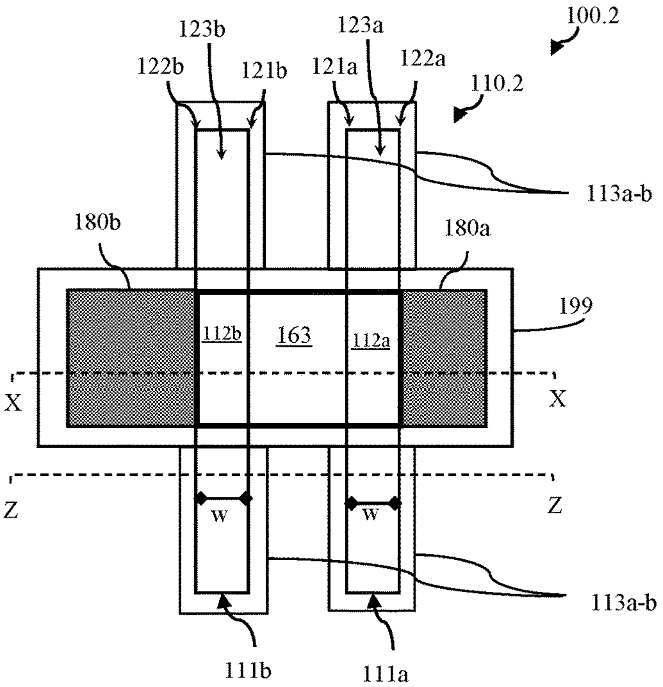
FIG. 1.2A
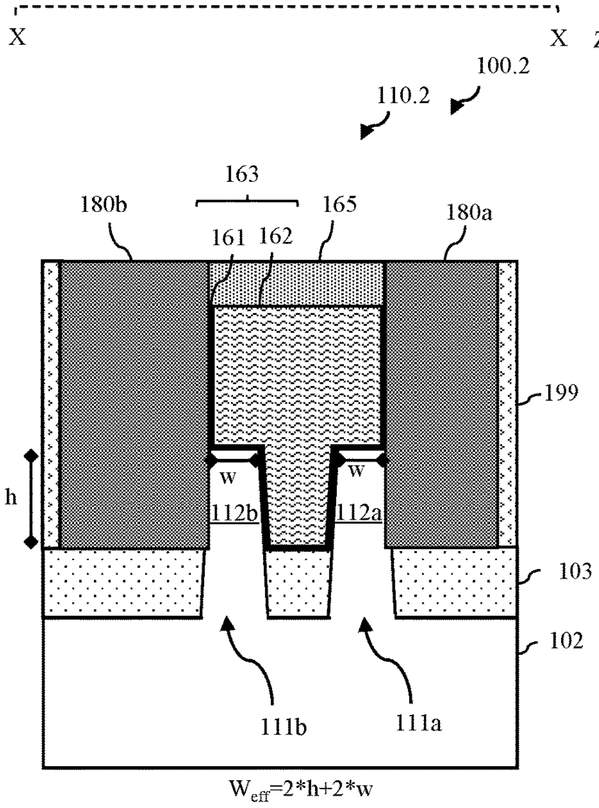
FIG. 1.2B
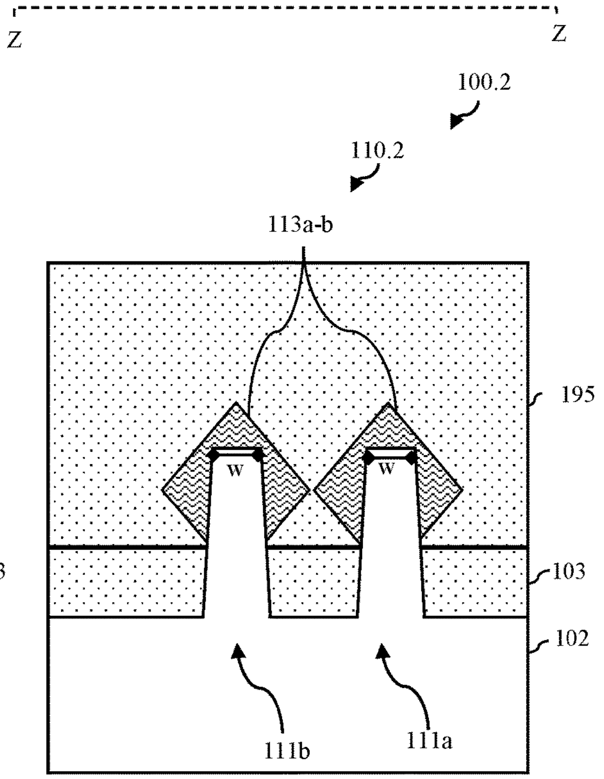
FIG. 1.2C

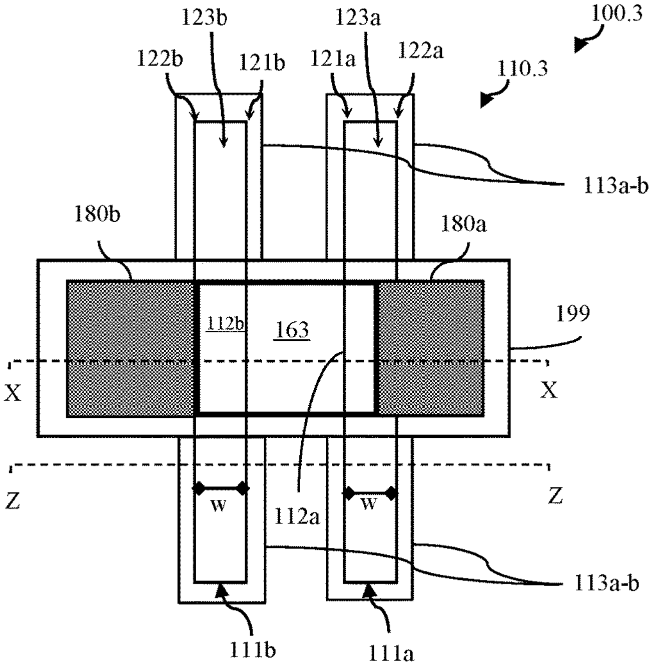
FIG. 1.3A
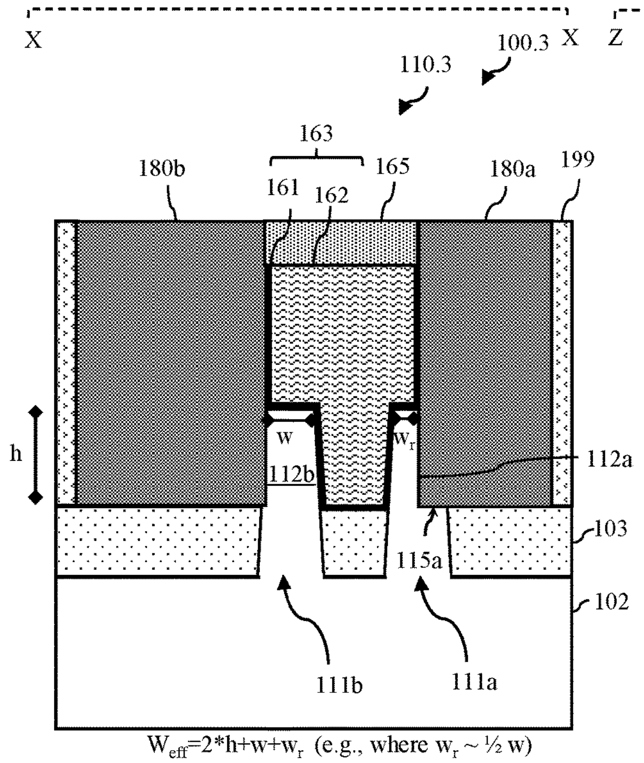
$W_{eff}$=2*h+w+$w_r$ (e.g., where $w_r$ ~ ½ w)
FIG. 1.3B
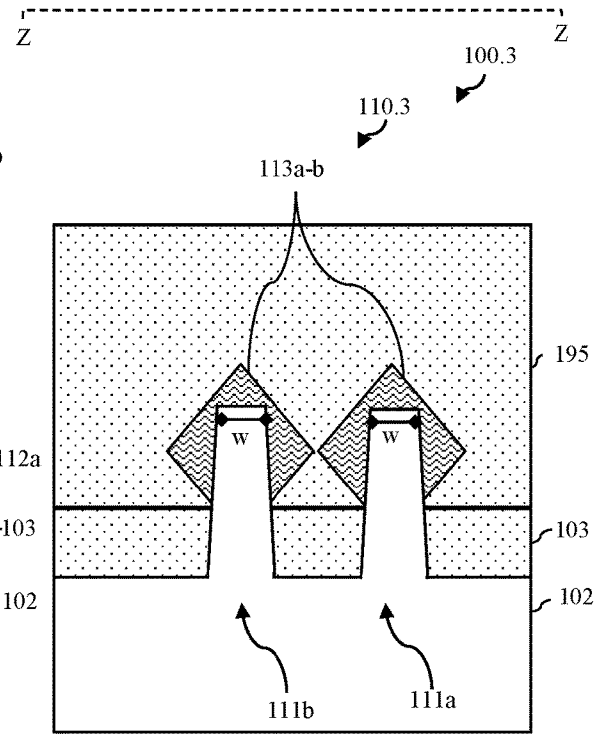
FIG. 1.3C

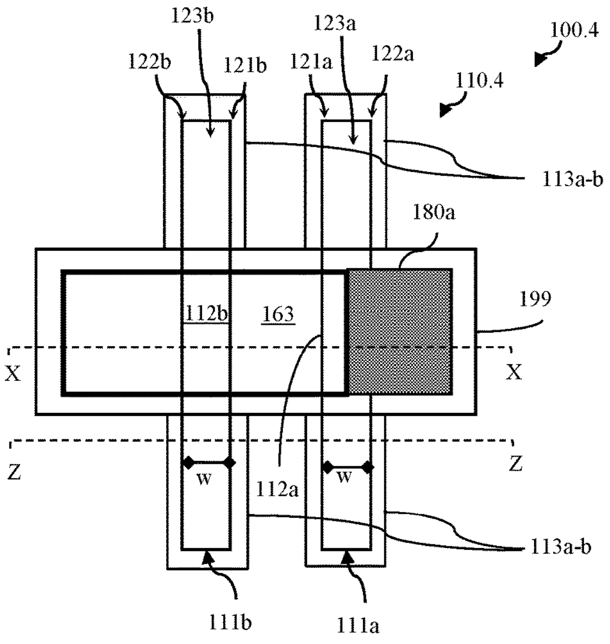
FIG. 1.4A
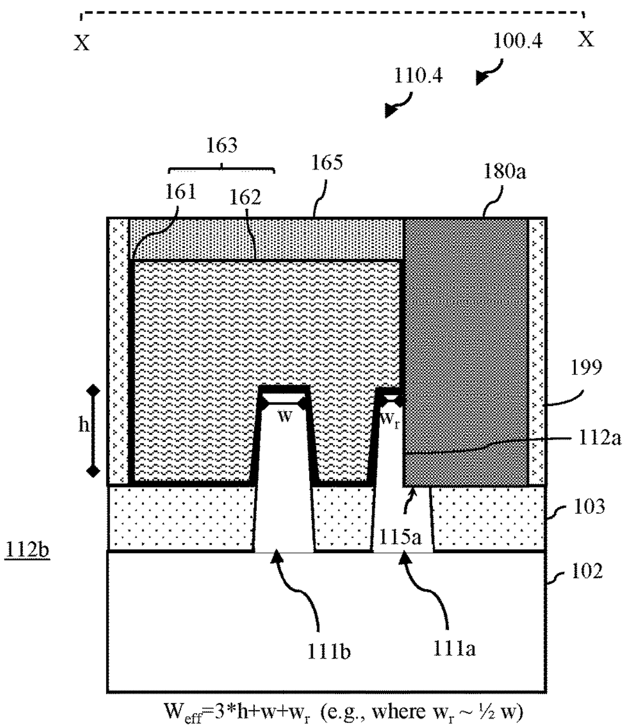
$W_{eff}$=3*h+w+$w_r$ (e.g., where $w_r$ ~ ½ w)
FIG. 1.4B
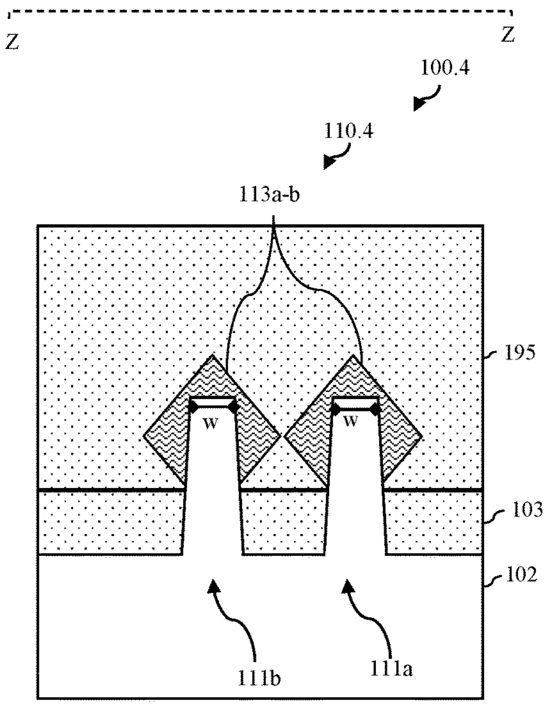
FIG. 1.4C

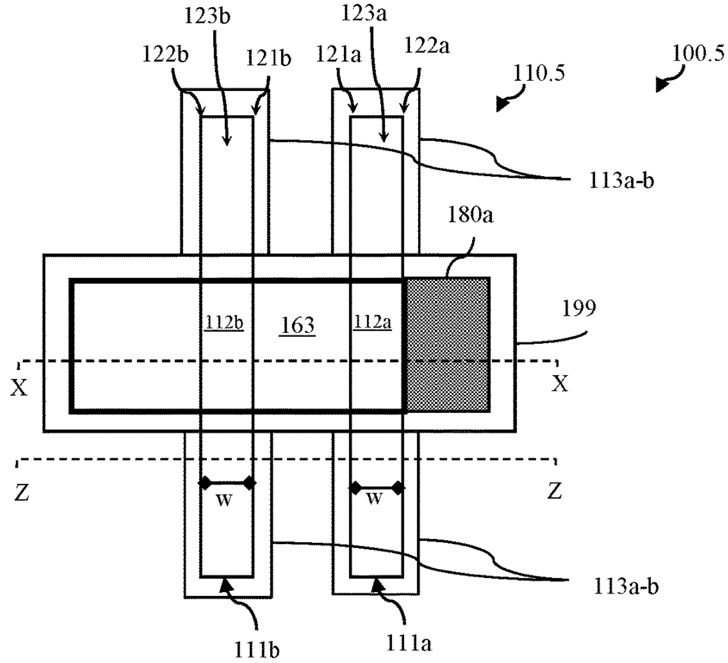
FIG. 1.5A
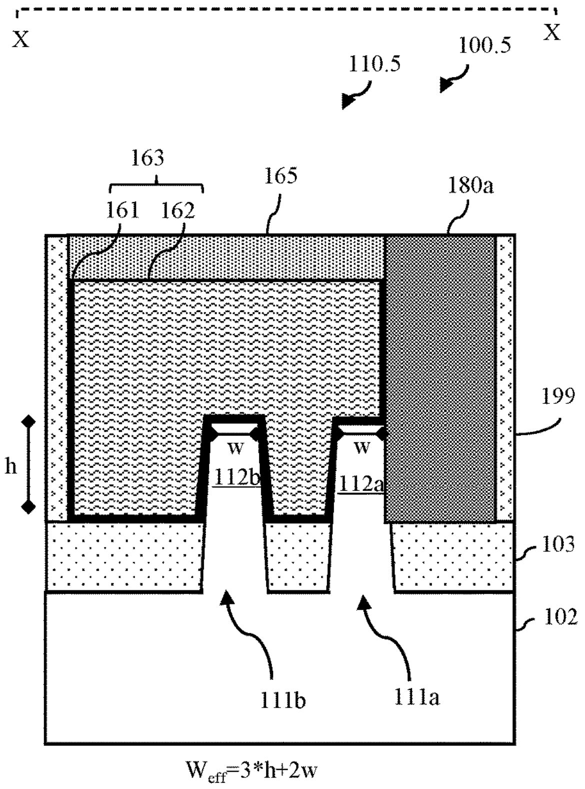
FIG. 1.5B
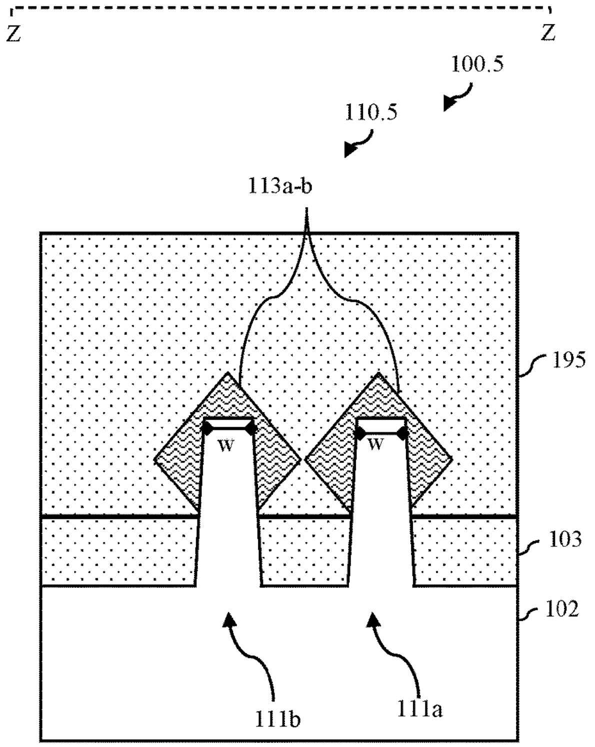
FIG. 1.5C

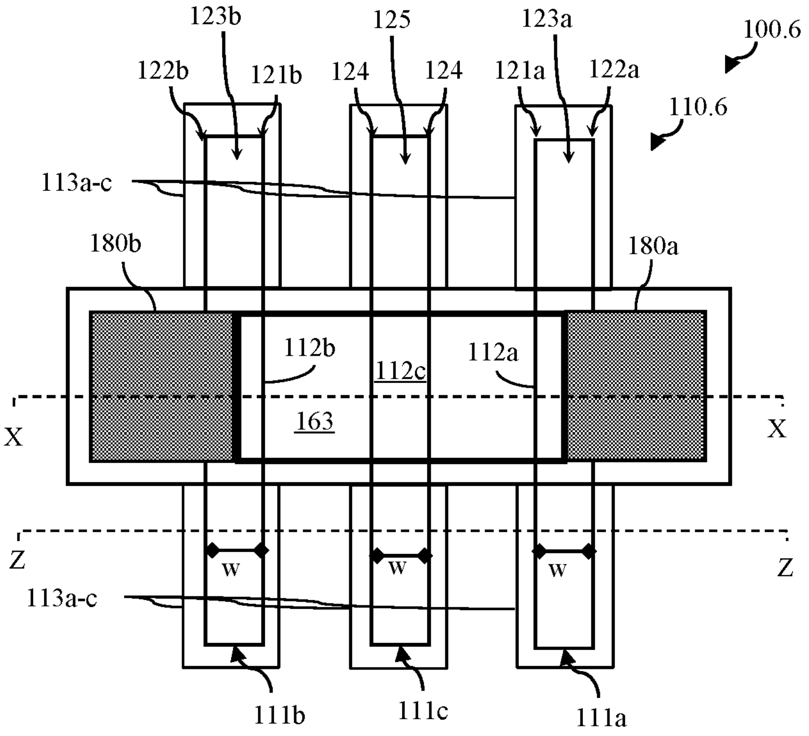
FIG. 1.6A
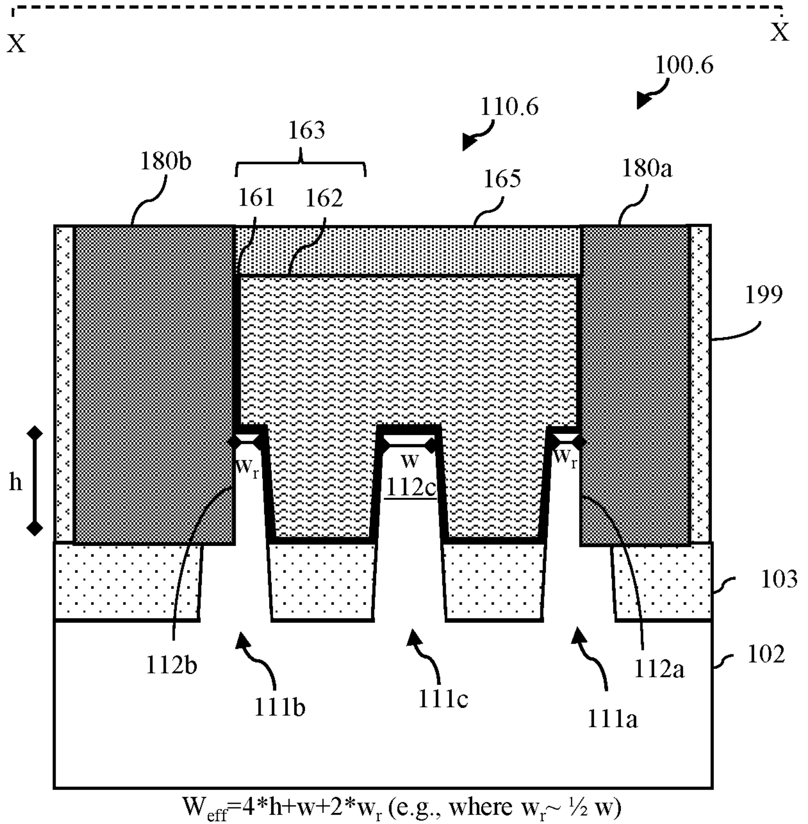
$W_{eff}$=4*h+w+2*$w_r$ (e.g., where $w_r$~ ½ w)
FIG. 1.6.B

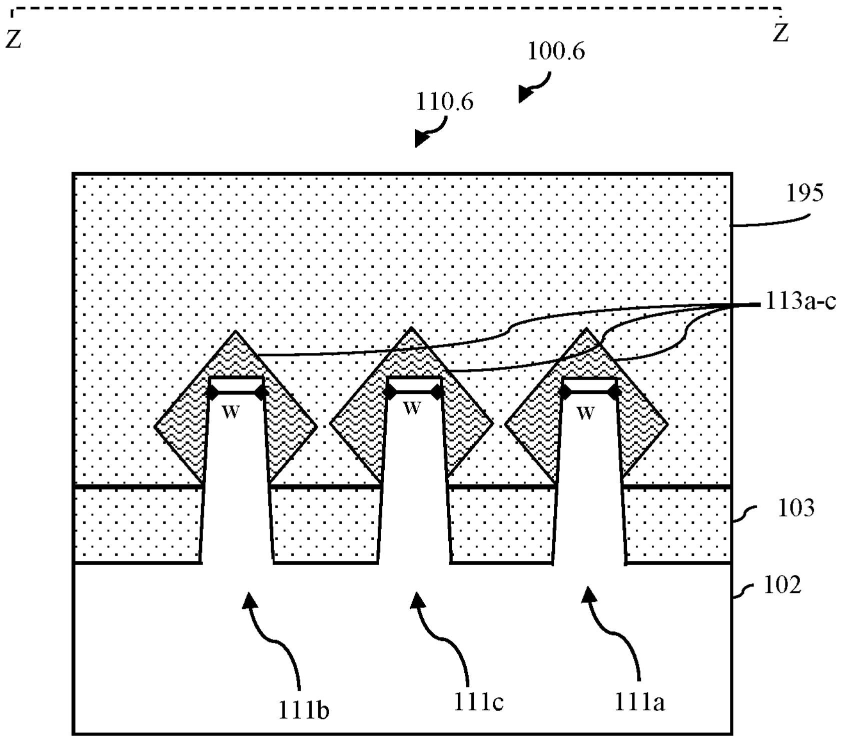
FIG. 1.6C

Weff=2*h+2*$w_r$ (e.g., where $w_r$~ ½ w)

MULTI-FIN FIN-TYPE FIELD EFFECT TRANSISTOR WITH FINE-TUNED EFFECTIVE CHANNEL WIDTH

BACKGROUND

The present disclosure relates fin-type field effect transistors (FINFETs) and, more particularly, to embodiments of a multi-fin FINFET and a method of forming a multi-fin FINFET.

A single-fin FINFET includes a semiconductor fin and a gate, the latter of which is adjacent to the top surface and opposing side walls of the semiconductor fin at a channel region. The effective channel width ($W_{eff}$) is equal to twice the fin height (h) plus the top surface fin width (w) at the channel region (i.e., $W_{eff}$=2h+w). At some FINFET technology nodes, integrated circuit (IC) designers do not have the option of using single-fin FINFETs because of significant process variations that can lead to performance degradation. So, multi-fin FINFETs are used instead. In such multi-fin FINFETs, each semiconductor fin has essentially the same dimensions and $W_{eff}$=Σ(2h+w); where h is the fin height, where w is the top surface fin width, and where i is the number of semiconductor fins. Use of multi-fin FINFETs makes it difficult to fine tune $W_{eff}$. For example, a designer cannot include, within an IC design, a multi-fin FINFET with a $W_{eff}$<Σ$(2h+w)_2$ (e.g., with a $W_{eff}$=2h+w).

SUMMARY

Disclosed herein are embodiments of a semiconductor structure. The semiconductor structure can include at least two semiconductor fins including a first semiconductor fin and a second semiconductor fin parallel to the first semiconductor fin. The first semiconductor fin can have a first top surface and first opposing sidewalls (including a first inner sidewall and a first outer sidewall opposite the first inner sidewall). The second semiconductor fin can have a second top surface and second opposing sidewalls (including a second inner sidewall facing the first inner sidewall of the first semiconductor fin and a second outer sidewall opposite the second inner sidewall). The semiconductor structure can further include a first isolation structure, which is positioned laterally immediately adjacent (i.e., abutting) the first outer sidewall of the first semiconductor fin, and a gate, which is positioned laterally immediately adjacent to the first inner sidewall of the first semiconductor fin opposite the first isolation structure and which further extends over the first top surface such that it is also positioned laterally immediately adjacent to the first isolation structure.

Some disclosed embodiments of the semiconductor structure can include more than two semiconductor fins including a first semiconductor fin, a second semiconductor fin, and at least one additional semiconductor fin between and parallel to the first semiconductor fin and the second semiconductor fin. The first semiconductor fin can have a first top surface and first opposing sidewalls (including a first inner sidewall and a first outer sidewall opposite the first inner sidewall). The second semiconductor fin can have a second top surface and second opposing sidewalls (including a second inner sidewall and a second outer sidewall opposite the second inner sidewall). Each additional semiconductor fin can have an additional top surface and additional opposing sidewalls. As described in greater detail below, the first inner sidewall of the first semiconductor fin and the second inner sidewall of the second semiconductor can each face a different additional opposing sidewall (e.g., of the same additional semiconductor fin or, alternatively, of different additional semiconductor fins). The semiconductor structure can further include a first isolation structure, which is positioned laterally immediately adjacent (i.e., abutting) the first outer sidewall of the first semiconductor fin. The semiconductor structure can further include a gate, which is positioned laterally immediately adjacent to the first inner sidewall of the first semiconductor fin opposite the first isolation structure and which further extends over the first top surface such that it is also positioned laterally immediately adjacent to the first isolation structure. The gate can further be positioned laterally immediately adjacent to the additional opposing sidewalls and the additional top surface of each additional semiconductor fin and immediately adjacent to at least the second inner sidewall and the second top surface of the second semiconductor fin.

Also disclosed herein are method embodiments for forming the disclosed semiconductor structures. For example, a disclosed method can include forming multiple semiconductor fins. The multiple semiconductor fins can include at least a first semiconductor fin and a second semiconductor fin parallel to the first semiconductor fin. The first semiconductor fin can have a first top surface and first opposing sidewalls (including a first inner sidewall and a first outer sidewall opposite the first inner sidewall). The second semiconductor fin can have a second top surface and second opposing sidewalls (including a second inner sidewall facing the first inner sidewall of the first semiconductor fin) and a second outer sidewall opposite the second inner sidewall. The method can further include forming a first isolation structure positioned laterally immediately adjacent to the first outer sidewall. The method can further include forming a gate positioned laterally immediately adjacent to the first inner sidewall of the first semiconductor fin opposite the first isolation structure and further extending over the first top surface of the first semiconductor fin to the first isolation structure.

BRIEF DESCRIPTION OF THE DRAWINGS

The present disclosure will be better understood from the following detailed description with reference to the drawings, which are not necessarily drawn to scale and in which:

FIG. 1.1A is a layout diagram and FIGS. 1.1B-1.1C are different cross-section diagrams illustrating a disclosed embodiment of a semiconductor structure;

FIG. 1.2A is a layout diagram and FIGS. 1.2B-1.2C are different cross-section diagrams illustrating another disclosed embodiment of a semiconductor structure;

FIG. 1.3A is a layout diagram and FIGS. 1.3B-1.3C are different cross-section diagrams illustrating yet another disclosed embodiment of a semiconductor structure;

FIG. 1.4A is a layout diagram and FIGS. 1.4B-1.4C are different cross-section diagrams illustrating yet another disclosed embodiment of a semiconductor structure;

FIG. 1.5A is a layout diagram and FIGS. 1.5B-1.5C are different cross-section diagrams illustrating yet another disclosed embodiment of a semiconductor structure;

FIG. 1.6A is a layout diagram and FIGS. 1.6B-1.6C are different cross-section diagrams illustrating yet another disclosed embodiment of a semiconductor structure;

DETAILED DESCRIPTION

Figure 2A:
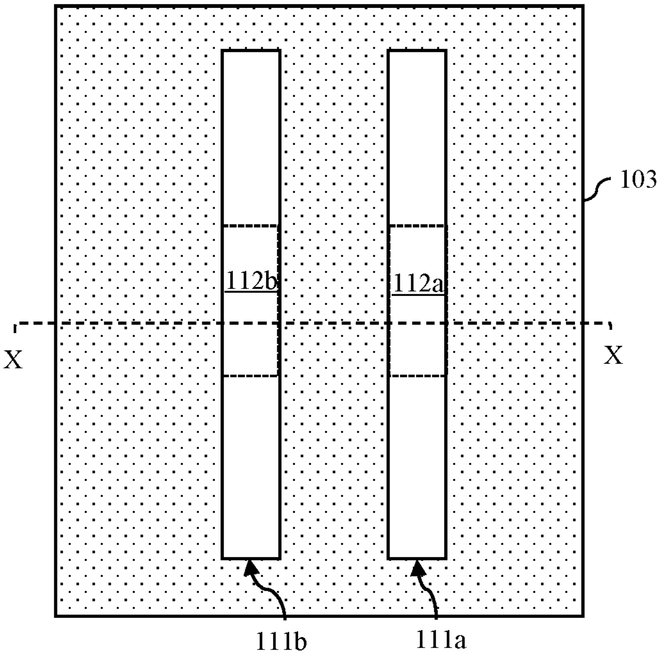
FIG. 2A is a layout diagram and FIG. 2B is a cross-section diagram illustrating a partially completed semiconductor structure formed according to a disclosed method.

As mentioned above, a single-fin FINFET includes a semiconductor fin and a gate, which is adjacent to the top surface and opposing side walls of the semiconductor fin at a channel region. The effective channel width ($W_{eff}$) is equal to twice the fin height (h) plus the top surface fin width (w) at the channel region (i.e., $W_{eff}$=2h+w). At some FINFET technology nodes, integrated circuit (IC) designers do not have the option of using single-fin FINFETs because of significant process variations that can lead to performance degradation. So, multi-fin FINFETs are used instead. In such multi-fin FINFETs, each semiconductor fin has essentially the same dimensions and $W_{eff}=\Sigma(2h+w)_i$, where h is the fin height, where w is the top surface fin width, and where i is the number of semiconductor fins. As a result, it can be difficult to fine tune $W_{eff}$. For example, a designer cannot include, within an IC design, a multi-fin FINFET with a $W_{eff}<\Sigma(2h+w)_2$ (e.g., with a $W_{eff}$=2h+w).

In view of the foregoing, disclosed herein are embodiments of a semiconductor structure including a multi-fin FINFET with a fine-tuned $W_{eff}$ (e.g., a multi-fin FINFET where $W_{eff}\neq\Sigma(2h+w)_i$, such as a two-fin FINFET where $W_{eff}$=2h+w). The multi-fin FINFET can include a first semiconductor fin, a second semiconductor fin, and, optionally, one or more additional semiconductor fins between and parallel to the first and second semiconductor fins. Each semiconductor fin can include a channel region between source/drain regions. A first isolation structure can be positioned laterally immediately adjacent to an outer sidewall of the first semiconductor fin at the channel region. Optionally, the first isolation structure can further be seated within a groove in that outer sidewall so that the width of the first semiconductor fin at the channel region is effectively reduced (e.g., by half). A gate can be immediately adjacent to an inner sidewall of the first semiconductor fin at the channel region and can extend over the top surface of the first semiconductor fin to the isolation structure. The gate can further be immediately adjacent to the opposing sidewalls and top surface of each additional semiconductor fin(s) (if any) and at least an inner sidewall and top surface of the second semiconductor fin. In some embodiments, a second isolation structure can be positioned laterally immediately adjacent to an outer sidewall of the second semiconductor fin and the gate can extend over the second top surface of the second semiconductor fin to the second isolation structure. Optionally, the second isolation structure can be seated within a groove in that outer sidewall so that the width of the second semiconductor fin at the channel region is effectively reduced (e.g., again by half). In other embodiments, the gate can be immediately adjacent to both the inner and outer sidewalls and the top surface of the second semiconductor fin. Thus, in the disclosed embodiments, the portion of $W_{eff}$ of the FINFET attributable to the first semiconductor fin and, optionally, the portion of $W_{eff}$ of the FINFET attributable to the second semiconductor fin are each reduced (e.g., to h+w, to h+½w, or to h+ some other fraction of w), while the portion of $W_{eff}$ attributable to each additional semiconductor fin (if any) between the first semiconductor fin and the second semiconductor fin remains at 2h+w.

Referring to FIGS. 1.1A-1.1C, FIGS. 1.2A-1.2C, FIGS. 1.3A-1.3C, FIGS. 1.4A-1.4C, FIGS. 1.5A-1.5C, and FIGS. 1.6A-1.6C, disclosed herein are embodiments of a semiconductor structure 100.1, 100.2, 100.3, 100.4, 100.5, and 100.6, each including a multi-fin FINFET 110.1, 110.2, 110.3, 110.4, 110.5, and 110.6, respectively. It should be noted that FIGS. 1.1A, 1.2A, 1.3A, 1.4A, 1.5A, and 1.6A are layout diagrams of the respective semiconductor structures. FIGS. 1.1B, 1.2B, 1.3B, 1.4B, 1.5B, and 1.6B are vertical cross-section diagrams of the respective semiconductor structures through the gates and channel regions of the multi-fin FINFET in a direction perpendicular to the semiconductor fins. FIGS. 1.1C, 1.2C, 1.3C, 1.4C, 1.5C, and 1.6C are vertical cross-section diagrams of the respective semiconductor structures through the source/drain regions of the multi-fin FINFET in a direction perpendicular to the semiconductor fins.

Referring to FIGS. 1.1A-1.6C, each semiconductor structure 100.1-100.6 can include multiple semiconductor fins. For purposes of this disclosure, a "semiconductor fin" refers to a relatively thin, elongated, semiconductor body with a bottom, a top surface opposite the bottom, and opposing sidewalls. Ideally, a semiconductor fin will have a three-dimensional rectangular shape with a uniform width between the opposing sidewalls from the bottom to the top surface. However, those skilled in the art will recognize that semiconductor fins are typically formed using a selective anisotropic etch process and, as a result of this etch process, the opposing sidewalls of the semiconductor fins may not be exactly vertical such that the semiconductor fins are narrower at the top surface than they are at the bottom. In one example, a semiconductor fin may have a height of 35-55 nm (e.g., 43 nm), a width at the bottom of 8-16 nm (e.g., 12), and a width (w) at the top surface of 6-10 nm (e.g., 8 nm).

The semiconductor fins can include a first semiconductor fin 111*a*, which has first opposing sidewalls (including a first inner sidewall 121*a* and a first outer sidewall 122*a* opposite first inner sidewall 121*a*) and a first top surface 123*a*. The semiconductor fins can include a second semiconductor fin 111*b*, which is parallel to first semiconductor fin 111*a* and which has second opposing sidewalls (including a second inner sidewall 121*b* and a second outer sidewall 122*b*) and a second top surface 123*b*. In the case of a two-fin structure (e.g., see the semiconductor structures 100.1-100.5), first inner sidewall 121*a* of first semiconductor fin 111*a* faces and is adjacent to, but physically separated from, second inner sidewall 121*b* of second semiconductor fin 111*b*. Optionally, the semiconductor fins can further include one or more additional semiconductor fins 111*c* between and parallel to first semiconductor fin 111_a_ and second semiconductor fin 111_b_ (e.g., see semiconductor structure 100.6). For purposes of illustration only, one additional semiconductor fin is shown in FIGS. 1.6A-1.6C. However, it should be understood that the figures are not intended to be limiting and that, alternatively, the multi-fin FINFET 100.6 could include any number of one or more additional semiconductor fins 111_c_. Each additional semiconductor fin 111_c_ has additional opposing sidewalls 124 and an additional top surface 125. First inner sidewall 121_a_ of first semiconductor fin 111_a_ is facing, but physically separated from, an additional opposing sidewall 124 of an adjacent additional semiconductor fin and, similarly, second inner sidewall 121_b_ of second semiconductor fin 111_b_ is facing, but physically separated from, a different additional opposing sidewall 124 of an adjacent additional semiconductor fin.

As illustrated, the first semiconductor fin 111_a_, the second semiconductor fin 111_b_, and, if applicable, any additional semiconductor fin 111_c_ can be etched into the top surface of a bulk semiconductor substrate 102. This bulk semiconductor substrate 102 can be, for example, a monocrystalline silicon (Si) substrate or a bulk semiconductor substrate of any other suitable monocrystalline semiconductor material (e.g., silicon germanium (SiGe), germanium (Ge), etc.). In this case, an insulator layer 103 can be on substrate 102 laterally surrounding lower portions of the semiconductor fins with upper portions of the semiconductor fins extending above the level of the top surface of insulator layer 103. The effective fin height (h) of a semiconductor fin can correspond to the height of the upper portion, as measured from the top surface of the insulator layer 103 to the top surface of the semiconductor fin. Insulator layer 103 can, for example, be a silicon dioxide ($SiO_2$) layer or a layer of any other suitable insulator material. Alternatively, the semiconductor fins can be etched into a semiconductor layer (e.g., a monocrystalline Si layer or a layer of some other suitable monocrystalline semiconductor material) of a semiconductor-on-insulator structure (e.g., a silicon-on-insulator (SOI) structure) or epitaxially grown within a mask.

Each semiconductor structure 100.1-100.6 can further include a multi-fin FINFET 110.1-110.6, each incorporating multiple semiconductor fins, as discussed above (or, more particularly, the upper portions thereof above the insulator layer 103). For purposes of illustration, FINFETs 110.1-110.5 of semiconductor structures 100.1-100.5 of FIGS. 1.1A-1.5C are shown as including only two semiconductor fins (i.e., a first semiconductor fin 111_a_ and a second semiconductor fin 111_b_ parallel to the first semiconductor fin 111_a_), whereas FINFET 110.6 of semiconductor structure 100.6 of FIGS. 1.6A-1.6C is shown as including three semiconductor fins (i.e., a first semiconductor fin 111_a_, a second semiconductor fin 111_b_, and an additional semiconductor fin 111_c_ between and parallel to the first semiconductor fin 111_a_ and the second semiconductor fin 111_b_).

FINFET 110.1-110.6 can be an N-type FET (NFET) or a P-type FET (PFET). In any case, within the FINFET 110.1-110.6, first semiconductor fin 111_a_, second semiconductor fin 111_b_, and, if applicable, any additional semiconductor fin 111_c_ can each further include a channel region positioned laterally between source/drain regions. Specifically, first semiconductor fin 111_a_ can have a first channel region 112_a_ positioned laterally between first source/drain regions 113_a_, second semiconductor fin 111_b_ can have a second channel region 112_b_ positioned laterally between second source/drain regions 113_b_, and, if applicable, each additional semiconductor fin 111_c_ can have an additional channel region 112_c_ positioned laterally between additional source/drain regions 113_c_. Various different source/drain configurations are known in the art and could be incorporated into FINFET 110.1-110.6. For example, the source/drain regions can include, for example, in situ doped epitaxial semiconductor material grown on the top surface and opposing sides of the semiconductor fins. The epitaxial semiconductor material on adjacent semiconductor fins can be physically separated such that each fin has discrete source/drain regions, as illustrated. Alternatively, the epitaxial semiconductor material on adjacent semiconductor fins can be merged so that the semiconductor fins have shared source/drain regions. Alternatively, the source/drain regions can have any other suitable source/drain region configuration known in the art. In any case, those skilled in the art will recognize that, typically, the channel regions of an NFET can be undoped (i.e., intrinsic) or, alternatively, doped so as to have P-type conductivity at a relatively low conductivity level (i.e., P− conductivity) and the source/drain regions can be doped so as to have N-type conductivity at a relatively high conductivity level (i.e., N+ conductivity or higher). The channel regions of a PFET can be undoped (i.e., intrinsic) or, alternatively, doped so as to have N-type conductivity at a relatively low conductivity level (i.e., N− conductivity) and the source/drain regions can be doped so as to have P-type conductivity at a relatively high conductivity level (i.e., P+ conductivity or higher).

Source/drain regions 113_a_, 113_b_, etc. can be covered with one or more middle of the line (MOL) dielectric layer(s) 195. Specifically, MOL dielectric layer(s) 195 can be on the top surface of the insulator layer 103 filling space around and between the semiconductor fins and source/drain regions and further extending over the source/drain regions. MOL dielectric layer(s) 195 can include, for example, an optional etch stop layer and a blanket interlayer dielectric (ILD) material layer on the etch stop layer. The optional etch stop layer can be, for example, a relatively thin conformal SiN layer or a relatively thin conformal layer of some other suitable etch stop material. The blanket ILD material layer can be, for example, a blanket layer of $SiO_2$ layer, a doped silicon glass layer (e.g., phosphosilicate glass (PSG) or borophosphosilicate glass (BPSG)), or a blanket layer of any other suitable ILD material.

FINFET 110.1-110.6 can further include a first isolation structure 180_a_ (also referred to herein as a first gate cut isolation region) positioned laterally immediately adjacent to first outer sidewall 122_a_ of first semiconductor fin 111_a_ at first channel region 112_a_. As illustrated, first isolation structure 180_a_ can, for example, be an essentially rectangular-shaped isolation structure including one or more layers of isolation material. The isolation material of first isolation structure 180_a_ can include, for example, an oxide, such as $SiO_2$ or a carbon-doped oxide dielectric (e.g., SiCOH), or some other suitable isolation material (e.g., SiON, etc.). In any case, the first isolation structure 180_a_ can be taller than first semiconductor fin 111_a_, as measured from the top surface of insulator layer 103.

Optionally, the first semiconductor fin 111_a_ can have a first groove 115_a_ in first outer sidewall 122_a_ at first channel region 112_a_. First groove 115_a_ can extend from first top surface 123_a_ of first semiconductor fin 111_a_ downward (e.g., to the top surface of insulator layer 103). In some embodiments, as shown in FINFET 110.1 of semiconductor structure 100.1 of FIGS. 1.1A-1.1C, FINFET 110.3 of semiconductor structure 100.3 of FIGS. 1.3A-1.3C, FINFET 110.4 of semiconductor structure 100.4 of FIGS. 1.4A-1.4C, and FINFET 110.6 of semiconductor structure 100.6 of FIGS. 1.6A-1.6C, the first isolation structure 180_a_ can be seated within (i.e., can fill) the first groove 115_a_. As a result, in these embodiments, first top surface 123*a* has a reduced width ($w_r$) at first channel region 112*a* (i.e., the width of the first semiconductor fin at the first channel region is narrower than the width at the first source/drain regions). For example, $w_r$~½w. Alternatively, $w_r$ could be some other fraction of w.

In some embodiments, as shown in FINFET 110.1 of semiconductor structure 100.1 of FIGS. 1.1A-1.1C, FINFET 110.2 of semiconductor structure 100.2 of FIGS. 1.2A-1.2C, FINFET 110.3 of semiconductor structure 100.3 of FIGS. 1.3A-1.3C, and FINFET 110.6 of semiconductor structure 100.6 of FIGS. 1.6A-1.6C, a second isolation structure 180*b* (also referred to herein as a second gate cut isolation region) can be positioned laterally immediately adjacent to second outer sidewall 122*b* of second semiconductor fin 111*b* at second channel region 112*b*. Like first isolation structure 180*a*, second isolation structure 180*b* can be an essentially rectangular-shaped isolation structure including one or more layers of isolation material and can be taller than second semiconductor fin 111*b*, as measured from the top surface of insulator layer 103. Optionally, in some of these embodiments, as shown in FINFET 110.1 of semiconductor structure 100.1 of FIGS. 1.1A-1.1C and FINFET 110.6 of semiconductor structure 100.6 of FIGS. 1.6A-1.6C, second semiconductor fin 111*b* can have a second groove 115*b* extending from the second top surface 123*b* of second semiconductor fin 111*b* downward (e.g., to the top surface of insulator layer 103). Second isolation structure 180*b* can be seated within (i.e., can fill) this second groove 115*b* and, as a result, in these embodiments, second top surface 123*b* has the reduced width ($w_r$) at the second channel region 112*b* (i.e., the width of the second semiconductor fin can be narrower at the second channel region than at the second source/drain regions). For example, $w_r$~½w. Alternatively, $w_r$ could be some other fraction of w.

FINFET 110.1-110.6 can further include gate 163. Gate 163 can include a conformal gate dielectric layer 161, including one or more layers of gate dielectric material, and a gate conductor layer 162, including one or more layers of gate conductor material. Gate 163 can be, for example, a replacement metal gate (RMG). An RMG can include, for example: a high-K gate dielectric layer; a work function metal layer on the high-K gate dielectric layer; an optional doped polysilicon gate conductor layer on the work function metal layer; and an optional metal silicide layer on the doped polysilicon gate conductor layer. See the detailed discussion of RMG materials below. In any case, gate 163 can be positioned laterally immediately adjacent to first inner sidewall 121*a* of first semiconductor fin 111*a* opposite first isolation structure 180*a* and can further extend over first top surface 123*a* of first semiconductor fin 111*a* to first isolation structure 180*a*. Thus, a side of gate 163 and first semiconductor fin 111*a* have aligned surfaces in contact with an essentially vertical surface of first isolation structure 180*a*. For purposes of this disclosure, an essentially vertical surface refers to a surface that is approximately perpendicular to the bottom surface of the substrate (e.g., plus or minus 30 degrees from perpendicular). Gate 163 can further be immediately adjacent to at least second inner sidewall 121*b* and second top surface 123*b* of second semiconductor fin 111*b*. As mentioned above, in some embodiments (e.g., see FINFET 110.1 of semiconductor structure 100.1 of FIGS. 1.1A-1.1C, FINFET 110.2 of semiconductor structure 100.2 of FIGS. 1.2A-1.2C, FINFET 110.3 of semiconductor structure 100.3 of FIGS. 1.3A-1.3C, and FINFET 110.6 of semiconductor structure 100.6 of FIGS. 1.6A-1.6C), a second isolation structure 180*b* can be immediately adjacent to a second outer sidewall 122*b* of second semiconductor fin 111*b*. In these embodiments, gate 163 can extend over second top surface 123*b* of second semiconductor fin 111*b* to second isolation structure 180*b*. Thus, a side of gate 163 and second semiconductor fin 111*b* have aligned surfaces in contact with an essentially vertical surface of second isolation structure 180*b*. For purposes of this disclosure, an essentially vertical surface refers to a surface that is approximately perpendicular to the bottom surface of the substrate (e.g., plus or minus up 30 degrees from perpendicular). In other embodiments and, particularly, embodiments without such a second isolation structure 180*b* (e.g., see FINFET 110.4 of semiconductor structure 100.4 of FIGS. 1.4A-1.4C and FINFET 100.5 of semiconductor structure 100.5 of FIGS. 1.5A-1.5C), gate 163 can be positioned immediately adjacent to second inner sidewall 121*b*, second outer sidewall 122*b*, and second top surface 123*b* of second semiconductor fin 111*b*. In embodiments with additional semiconductor fin(s) 111*c*, which are positioned laterally between and parallel to first semiconductor fin 111*a* and second semiconductor fin 111*b* (e.g., see FINFET 110.6 of semiconductor structure 100.6 of FIGS. 1.6A-1.6C), gate 163 can further be immediately adjacent to additional opposing sidewalls 124 and additional top surface 125 of each additional semiconductor fin 111*c*.

FINFET 110.1-110.6 can further include gate sidewall spacers 199 laterally surrounding gate 163 and any isolation structure adjacent thereto (i.e., the first isolation structure 180*a* and, if applicable, the second isolation structure 180*b*). Gate sidewall spacers 199 can include one or more layers of dielectric sidewall spacer material (e.g., SiN, carbon-doped SiN, silicon boron carbon nitride (SiBCN) or any other suitable dielectric sidewall spacer material). Gate sidewall spacers 199 can electrically isolate gate 163 from the source/drain regions.

As mentioned above, a multi-fin FINFET will typically have semiconductor fins with the same dimensions and a $W_{eff}=\Sigma(2h+w)_i$, where h is the effective fin height (e.g., as measured from the top surface of the insulator layer 103), where w is top surface fin width at the channel region, and where i is the number of semiconductor fins. In other words, in a multi-fin FINFET the portion of $W_{eff}$ attributable to each semiconductor fin is typically essentially the same. In the disclosed embodiments, the portion of $W_{eff}$ attributable to first semiconductor fin 111*a* and, optionally, to second semiconductor fin 111*b* can be modified (e.g., fine-tuned) given placement of first isolation structure 180*a* and, optionally, a second isolation structure 180*b*. Specifically, first isolation structure 180*a* and, optionally, second isolation structure 180*b* can be placed so as to reduce the portion of $W_{eff}$ attributable to first semiconductor fin 111*a* and, optionally, second semiconductor fin 111*b* to at most h+w, where h is the effective fin height as measured from the top surface of insulator layer 103 and where w is the top surface fin width, as originally patterned. In some embodiments, it can be reduced to $h+w_r$, where $w_r$ is a reduced fin width that is, for example, ~½w.

The FINFETs 110.1-110.6 as described above and shown in the figures illustrate various different combinations of isolation structure placement that lead to different effective channel widths. For example, two-fin FINFET 110.1 in semiconductor structure 100.1 of FIGS. 1.1A-1.1C has a $W_{eff}=2*h+2*w_r$. In this case if $w_r$~½w, then $W_{eff}$ is essentially equal to that of a single-fin FINFET (i.e., 2*h+w). Two-fin FINFET 110.2 in semiconductor structure 100.2 of FIGS. 1.2A-1.2C has a $W_{eff}=2*h+2*w$. Two-fin FINFET 110.3 in semiconductor structure 100.3 of FIGS. 1.3A-1.3C has a $W_{eff}$=2*h+w+$w_r$. Two-fin FINFET 110.4 in semiconductor structure 100.4 of FIGS. 1.4A-1.4C has a $W_{eff}$=3*h+w+$w_r$. Two-fin FINFET 110.5 in semiconductor structure 100.5 of FIGS. 1.5A-1.5C has a $W_{eff}$=3*h+2*w. Three-fin FINFET 110.6 in semiconductor structure 100.6 of FIGS. 1.6A-1.6C has a $W_{eff}$=4*h+w+2*$w_r$. It should be understood that the embodiments described above and shown in the figures are not intended to be limiting. For example, given the presence or absence of the first semiconductor fin and/or the second semiconductor fin and specific placement thereof, $W_{eff}$ of three-fin FINFETs, four-fin FINFETs, etc. can be similarly modified or fine-tuned during manufacturing.

Also disclosed herein are method embodiments for forming a semiconductor structure having a multi-fin FINFET with fine-tuned Weff, such as any of the semiconductor structures 100.1-100.6 described in detail above and illustrated in FIGS. 1.1A-1.6C. For purposes of illustration, the method embodiments are described below and illustrated in the figures specifically with respect to the semiconductor structure 100.1 of FIGS. 1.1A-1.1C.

Figure 2B:
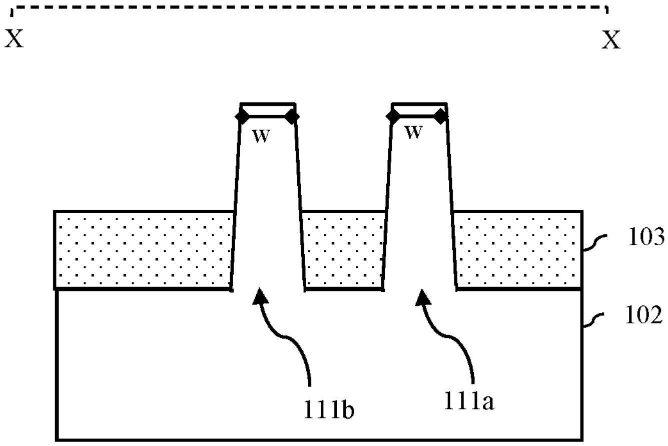

The method can include forming multiple parallel semiconductor fins. The semiconductor fins can include a first semiconductor fin 111*a*, a second semiconductor fin 111*b*, and optionally one or more additional semiconductor fins (not shown) between and parallel to first semiconductor fin 111*a* and second semiconductor fin (see FIGS. 2A-2B). The semiconductor fins can be form using conventional semiconductor fin processing techniques (e.g., sidewall image transfer techniques, etc.). In some embodiments, the semiconductor fins can be patterned and etched into the top surface of a bulk semiconductor substrate 102 such that they extend essentially vertically upwards from a remaining portion of the bulk semiconductor substrate 102 below. This bulk semiconductor substrate 102 can be, for example, a monocrystalline Si substrate or a bulk semiconductor substrate of any other suitable monocrystalline semiconductor material (e.g., SiGe, Ge, etc.). After semiconductor fin formation on a bulk semiconductor substrate, an insulator layer 103 can be formed (e.g., deposited) over the partially completed structure and etched back such that insulator layer 103 laterally surrounds lower portions of the semiconductor fins and such that upper portions of the semiconductor fins extend some height (h) above the level of the top surface of insulator layer 103. Insulator layer 103 can, for example, be a silicon dioxide ($SiO_2$) layer or a layer of any other suitable insulator material. Alternatively, the semiconductor fins could be patterned and etched through a semiconductor layer (e.g., a monocrystalline Si layer or a layer of some other suitable monocrystalline semiconductor material) of a semiconductor-on-insulator structure (e.g., an SOI structure).

Figure 3A:
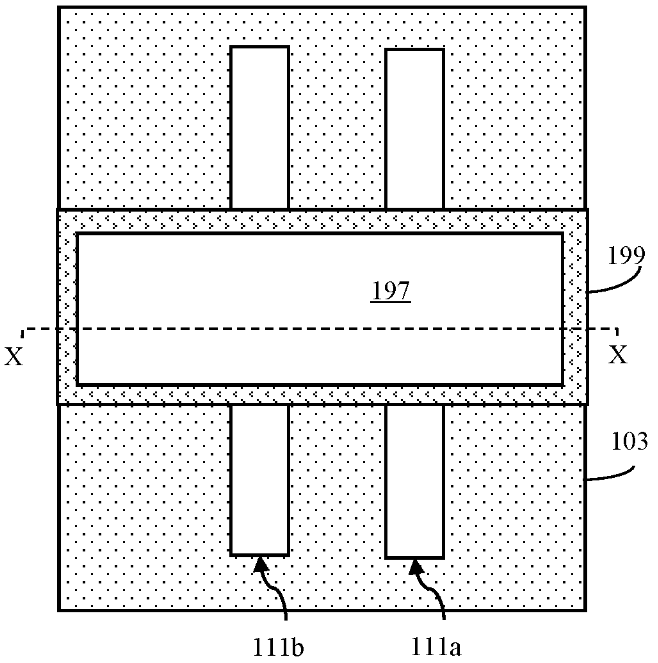
FIG. 3A is a layout diagram and FIG. 3B is a cross-section diagram illustrating a partially completed semiconductor structure formed according to a disclosed method.
Figure 3B:
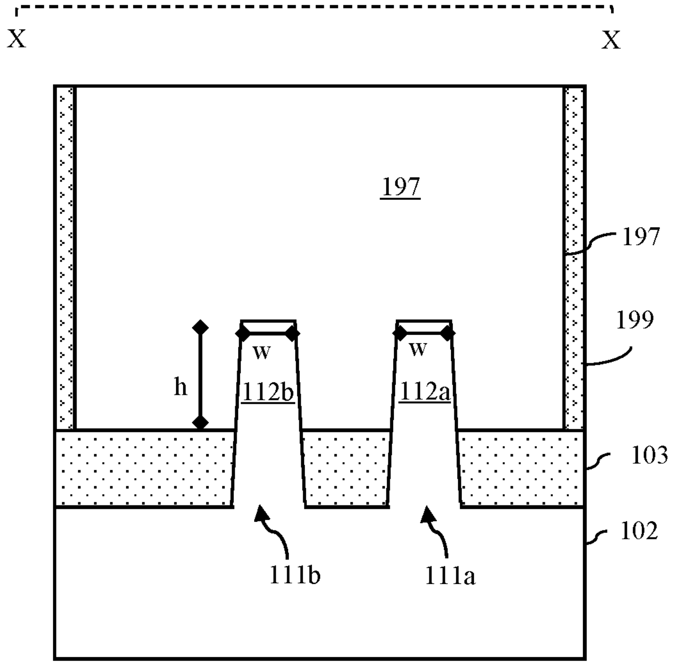

A sacrificial gate structure 197 can be formed (see FIGS. 3A-3B). For example, one or more sacrificial layers can be deposited over the partially completed structure. The sacrificial layers can include, for example, a conformal oxide layer and a blanket polysilicon layer on the conformal oxide layer. The sacrificial layers can also include a hard mask layer (e.g., a SiN hard mask layer) on the polysilicon layer. Conventional lithographic patterning and etch techniques can then be performed to pattern the layers of sacrificial materials into the sacrificial gate structure 197. As illustrated, sacrificial gate structure 197 can be an essentially rectangular-shaped body that traverses the semiconductor fins and, more particularly, is adjacent to the top surface and opposing sidewalls of each semiconductor fin at designated channel regions.

Conventional sidewall spacer formation techniques can then be performed to form dielectric gate sidewall spacers 199 on the sidewalls of sacrificial gate structure 197. For example, a layer of dielectric sidewall spacer material (e.g., SiN, carbon-doped SiN, SiBCN or any other suitable dielectric sidewall spacer material) can be conformally deposited over the partially completed structure. The dielectric sidewall spacer material can then be anisotropically etched, removing it from essentially horizontal surfaces and leaving it intact, as sidewall spacers, on essentially vertical surfaces.

Figure 4A:
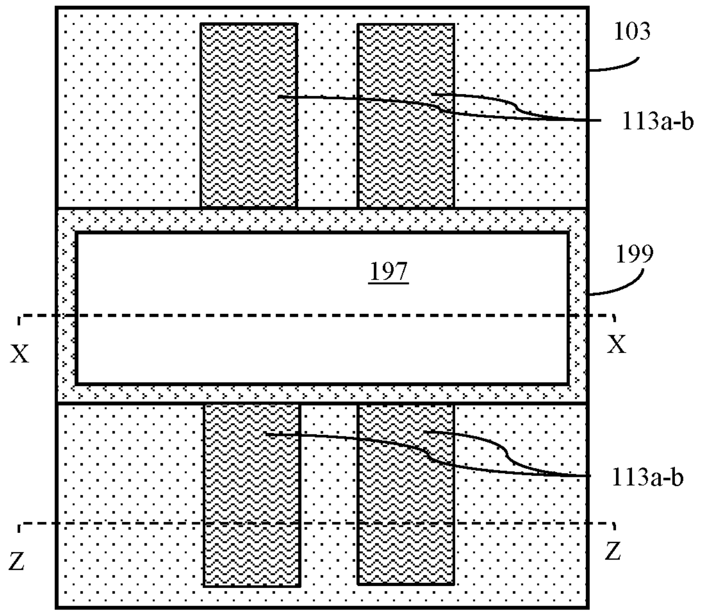
FIG. 4A is a layout diagram and FIGS. 4B-4C are different cross-section diagrams illustrating a partially completed semiconductor structure formed according to a disclosed method.
Figure 4B:
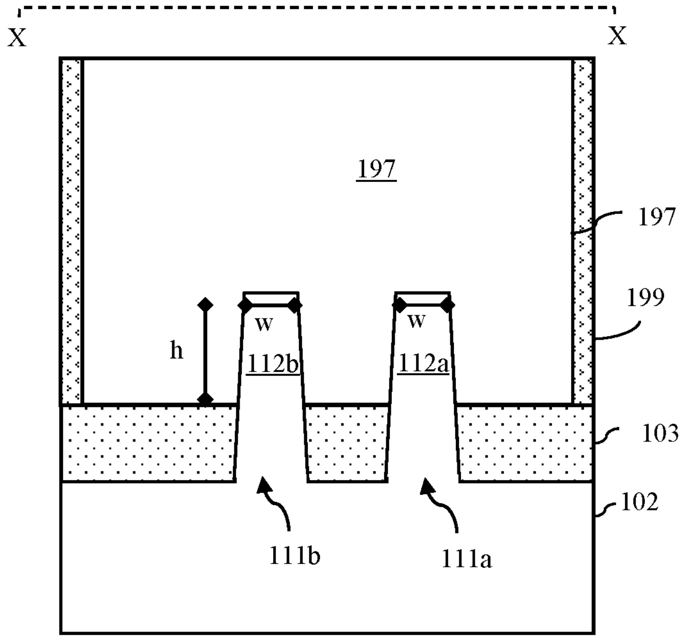
Figure 4C:
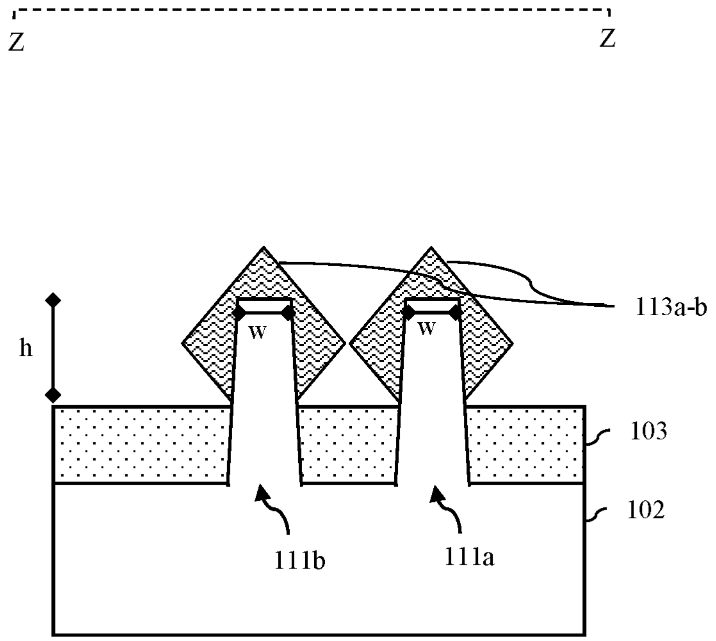

In situ doped epitaxial semiconductor material can be grown on exposed surfaces of semiconductor fins 111*a*, 111*b*, etc. on either side of sacrificial gate structure 197, thereby forming source/drain regions 113*a*, 113*b*, etc. (see FIGS. 4A, 4C). Those skilled in the art will recognize that whether the epitaxial semiconductor material is doped so as to have P-type conductivity or N-type conductivity depends upon whether the FINFET being formed is an NFET or PFET. For example, in an NFET, the channel regions can be undoped (i.e., intrinsic) or, alternatively, doped so as to have P-type conductivity at a relatively low conductivity level (i.e., P− conductivity) and the source/drain regions can be doped so as to have N-type conductivity at a relatively high conductivity level (i.e., N+ conductivity or higher). For a PFET, the channel regions can be undoped (i.e., intrinsic) or, alternatively, doped so as to have N-type conductivity at a relatively low conductivity level (i.e., N− conductivity) and the source/drain regions can be doped so as to have P-type conductivity at a relatively high conductivity level (i.e., P+ conductivity or higher).

Figure 5A:
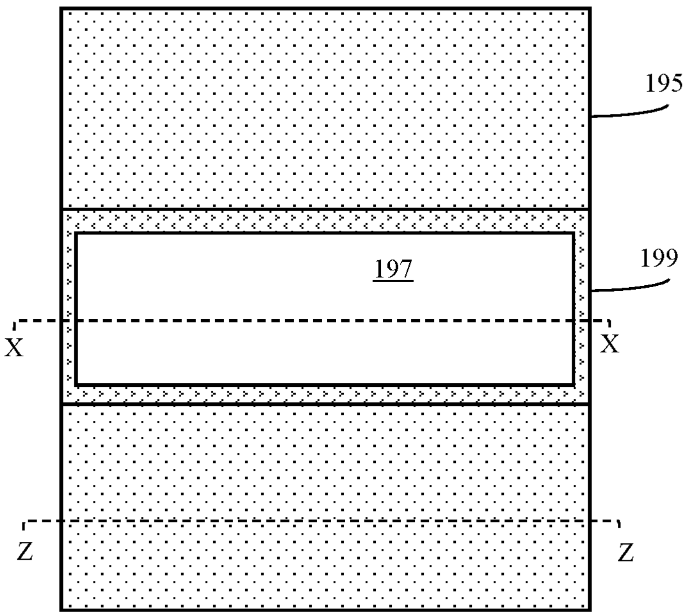
FIG. 5A is a layout diagram and FIGS. 5B-5C are different cross-section diagrams illustrating a partially completed semiconductor structure formed according to a disclosed method.
Figure 5B:
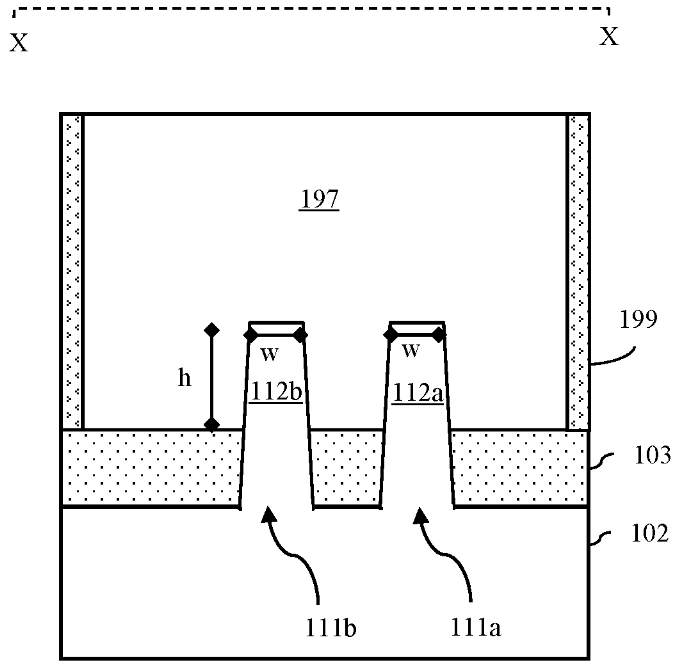
Figure 5C:
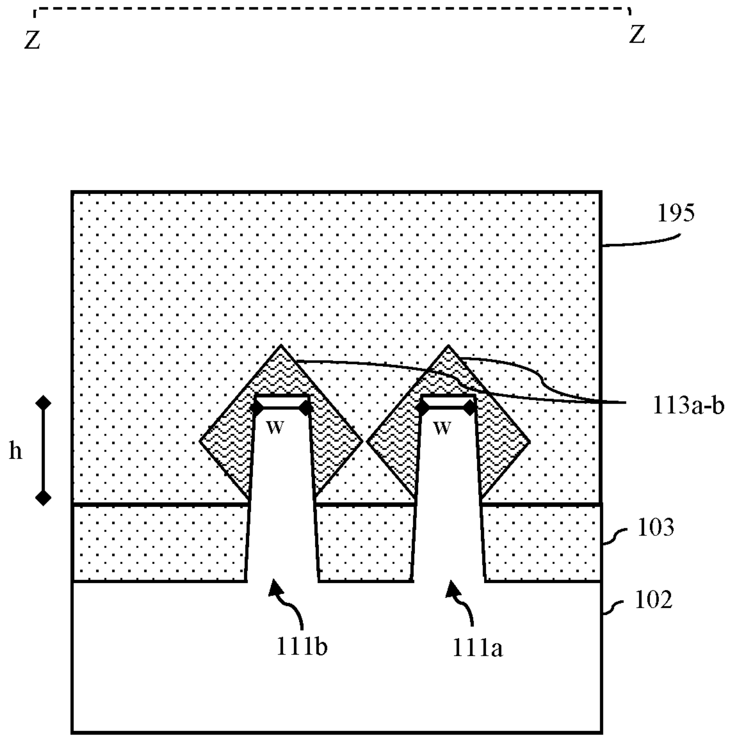

One or more MOL dielectric layer(s) 195 can be formed (e.g., deposited) over the partially completed semiconductor structure (see FIGS. 5A, 5C). MOL dielectric layer(s) 195 can include, for example, an optional etch stop layer and a blanket interlayer dielectric (ILD) material layer on the etch stop layer. The optional etch stop layer can be, for example, a relatively thin conformal SiN layer or a relatively thin conformal layer of some other suitable etch stop material. The blanket ILD material layer can be, for example, a blanket layer of $SiO_2$ layer, a doped silicon glass layer (e.g., phosphosilicate glass (PSG) or borophosphosilicate glass (BPSG)), or a blanket layer of any other suitable ILD material. A polishing process (e.g., a chemical mechanical polishing (CMP) process) can then be performed in order to expose sacrificial gate structure 197 (e.g., the polysilicon layer thereof).

In conventional FINFET processing, sacrificial gate structure 197 would then be selectively removed to form a gate opening and a gate (e.g., an RMG) would be formed within the gate opening such that it is on the opposing sides and top surface of each of the semiconductor fins at the designated channel regions therein. Contrarily, in the disclosed embodiments, prior to sacrificial gate structure removal, one or more isolation structures (also referred to herein as gate cut isolation structures) can be formed in sacrificial gate structure 197 (and partly into fin(s)) using conventional trench isolation formation techniques to selectively adjust the effective channel length of the resulting multi-fin FINFET.

Figure 6A:
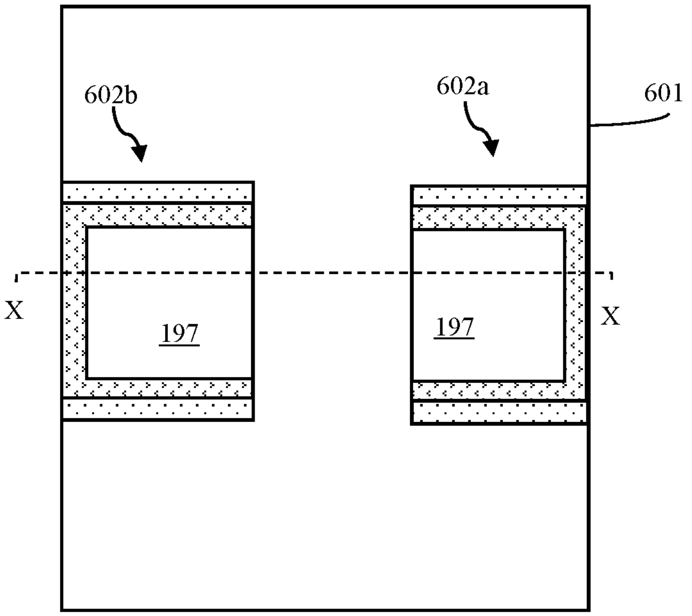
FIG. 6A is a layout diagram and FIG. 6B is a cross-section diagram illustrating a partially completed semiconductor structure formed according to a disclosed method.
Figure 6B:
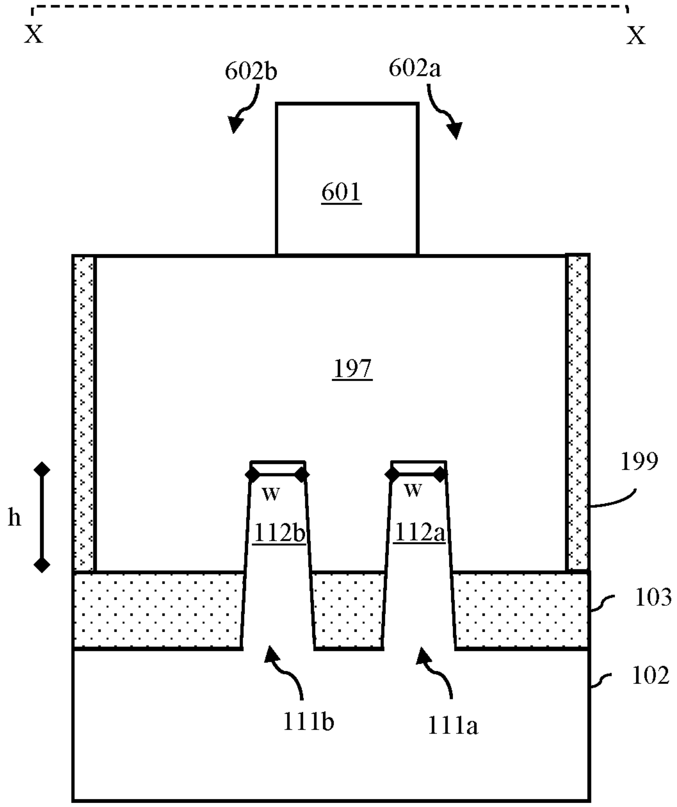
Figure 7A:
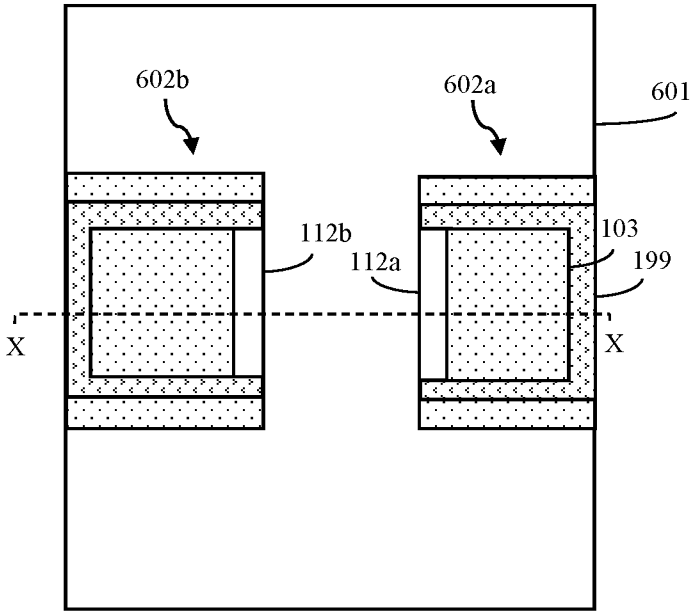
FIG. 7A is a layout diagram and FIG. 7B is a cross-section diagram illustrating a partially completed semiconductor structure formed according to a disclosed method.
Figure 7B:
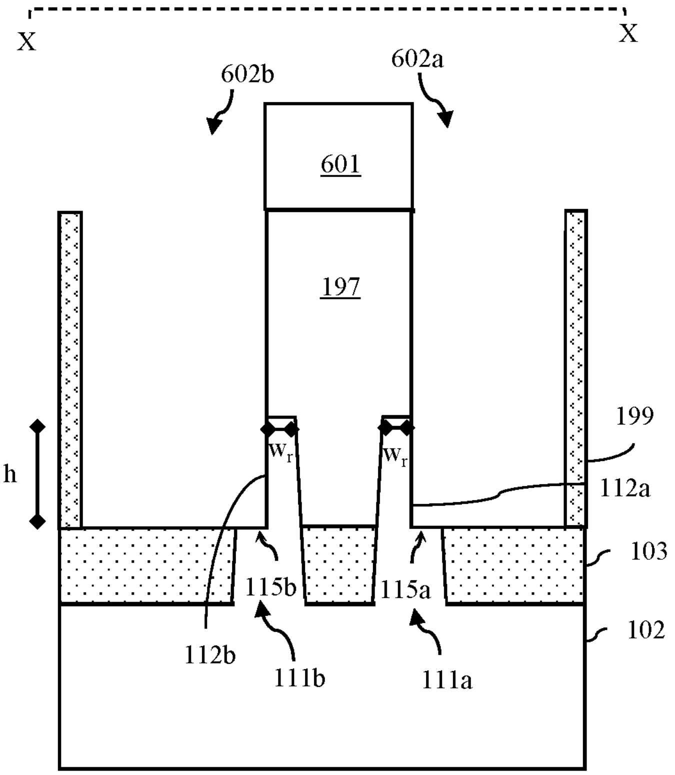

For example, a mask layer 601 can be formed over the partially completed structure and one or more openings 602*a*-602*b* can be formed in mask layer 601 (e.g., using conventional lithographic processing and etch techniques) to expose one or more sections of sacrificial gate structure 197 within which the one or more isolation structures, respectively, are to be formed (see FIGS. 6A-6B). One exposed section of the sacrificial gate structure can be adjacent to the first outer sidewall of the first semiconductor fin 111*a* and, optionally, another can be adjacent to the second outer sidewall of the second semiconductor fin 111*b*. Then, an anisotropic etch process can be performed to etch trench(es) in the exposed section(s) of sacrificial gate structure 197 down to insulator layer 103, thereby exposing the first outer sidewall of first semiconductor fin 111*a* at first channel region 112*a* and, optionally, the second outer sidewall of second semiconductor fin 111*b* at second channel region 112*b* (see FIGS. 7A-7B). It should be noted that the anisotropic etch process used to form the trench(es) can be selective for the sacrificial gate material (e.g., polycrystalline silicon) over any exposed dielectric material. However, it can be non-selective with respect to the sacrificial gate material (e.g., polycrystalline silicon) over the semiconductor fin material (e.g., monocrystalline silicon). Thus, if opening 602*a* extends partially over first semiconductor fin 111*a*, as illustrated, then a first groove 115*a* will be formed in the first outer sidewall of first semiconductor fin 111*a* at first channel region 112*a*, thereby resulting in a reduced fin width ($w_r$) at first channel region 112*a*. Similarly, if an opening 602*b* extends partially over second semiconductor fin 111*b*, as illustrated, then a second groove 115*b* will be formed in the second outer sidewall of second semiconductor fin 111*b* at second channel region 112*b*, thereby resulting in a reduced fin width ($w_r$) at second channel region 112*b*. In some embodiments, $w_r$~½w. Alternatively, $w_r$ could be some other fraction of w.

Figure 8A:
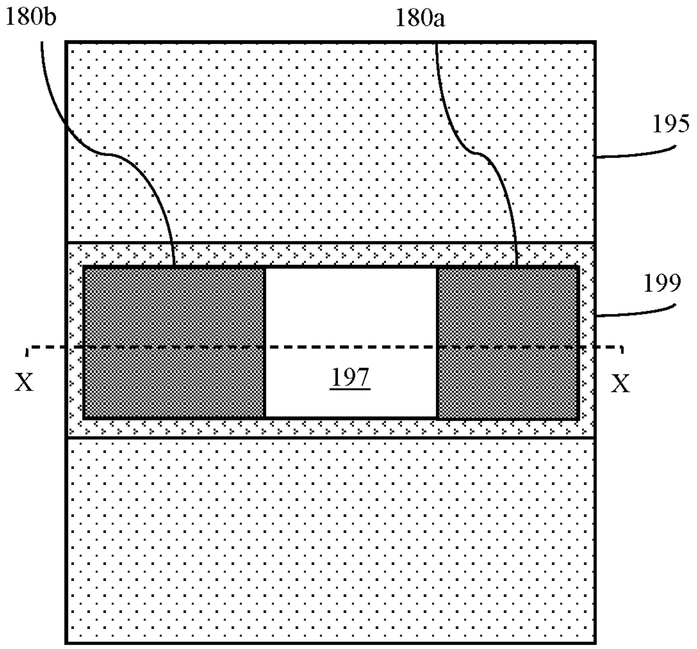
FIG. 8A is a layout diagram and FIG. 8B is a cross-section diagram illustrating a partially completed semiconductor structure formed according to a disclosed method.
Figure 8B:
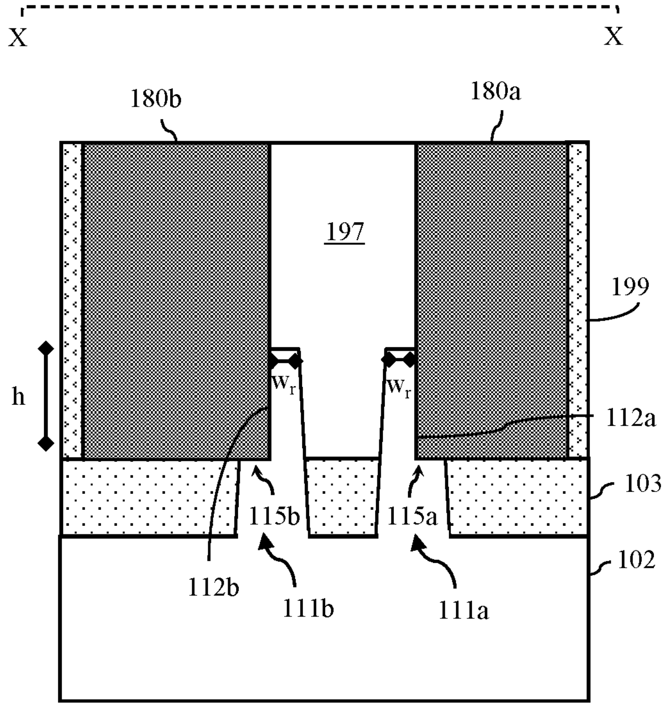

Following formation of openings 602*a*, 602*b*, mask layer 601 can be removed and a first isolation structure 180*a* can be formed in the trench adjacent to the first outer sidewall of first semiconductor fin 111*a* (e.g., seated within first groove 115*a*) and a second isolation structure 180*b* can be formed in the trench adjacent to the second outer sidewall of second semiconductor fin 111*b* (e.g., seated within second groove 115*b*) (see FIGS. 8A-8B). For example, one or more layers of isolation material can be deposited so as to fill the trenches. The isolation material can include, for example, an oxide, such as $SiO_2$ or a carbon-doped oxide dielectric (e.g., SiCOH), or some other suitable isolation material (e.g., SiON, etc.). Then, a polishing process (e.g., a CMP process) can be performed to remove any isolation material from above the remaining portion of sacrificial gate structure 197.

Figure 9A:
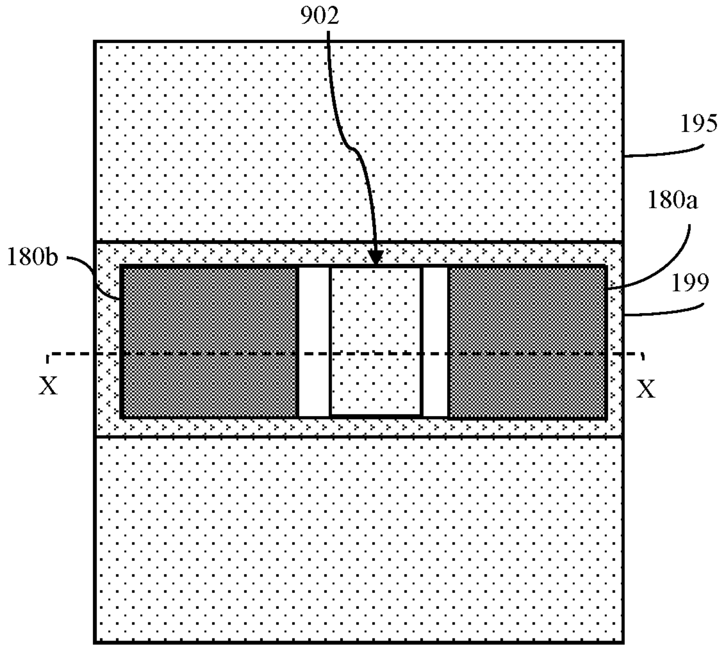
FIG. 9A is a layout diagram and FIG. 9B is a cross-section diagram illustrating a partially completed semiconductor structure formed according to a disclosed method.
Figure 9B:
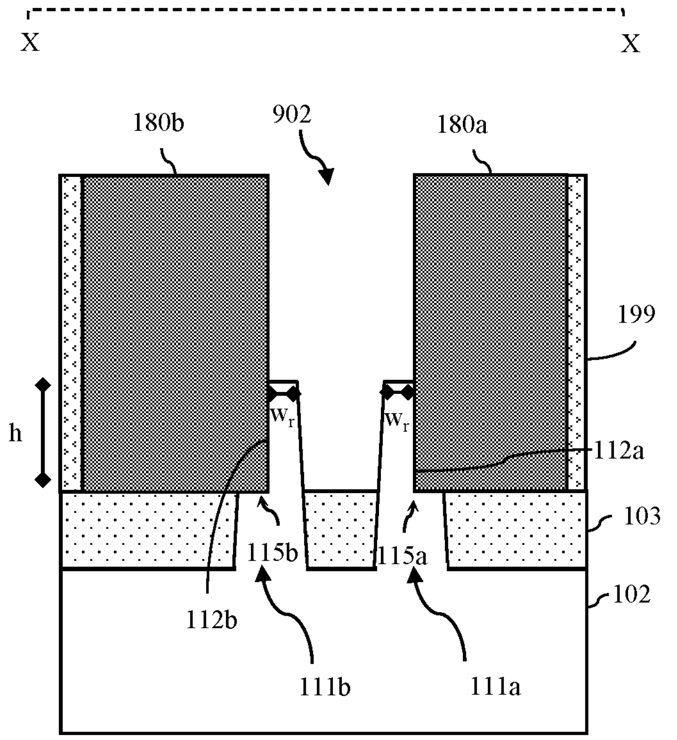

The remaining portion of sacrificial gate structure 197 can then be removed, creating a gate opening 902 (see FIGS. 9A-9B). It should be noted that the etch process employed to remove the remaining portion of sacrificial gate structure 197 should be selective for the material(s) of sacrificial gate structure 197 (e.g., polysilicon) over the material of semiconductor fins 111*a*, 111*b*, etc. (e.g., monocrystalline silicon) in order to preserve any exposed sections of semiconductor fins 111*a*, 111*b*, etc.

Figure 10A:
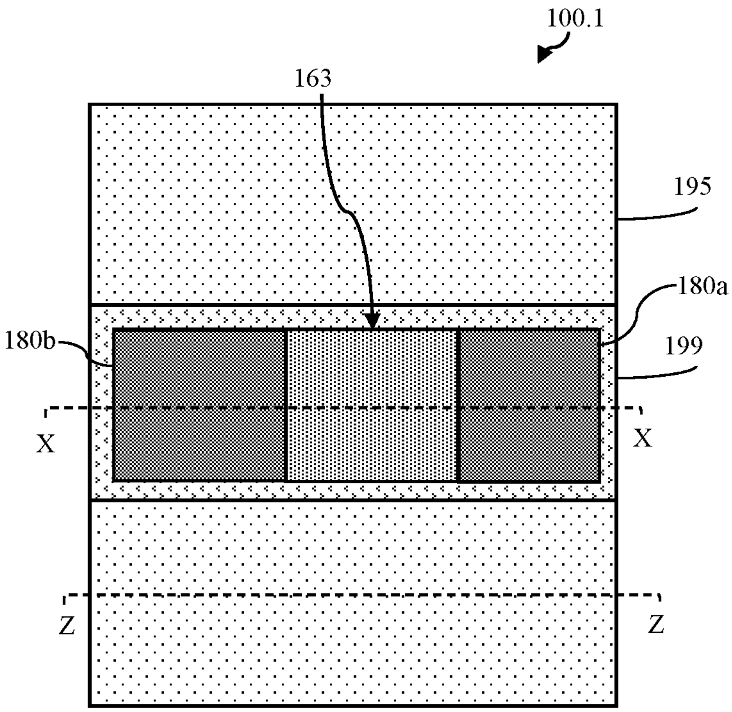
FIG. 10A is a layout diagram and FIGS. 10B-10C are different cross-section diagrams illustrating a partially completed semiconductor structure formed according to a disclosed method.
Figure 10B:
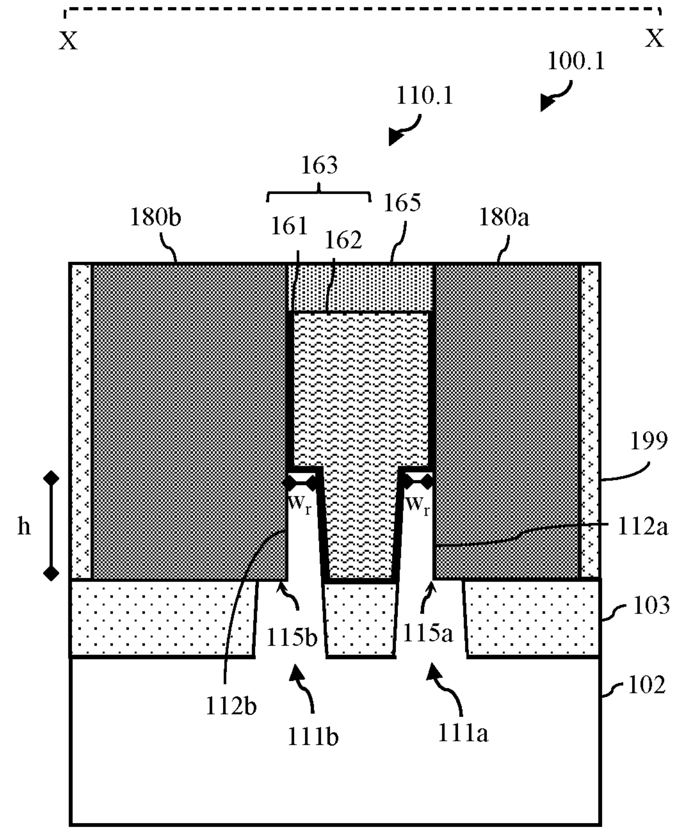
Figure 10C:
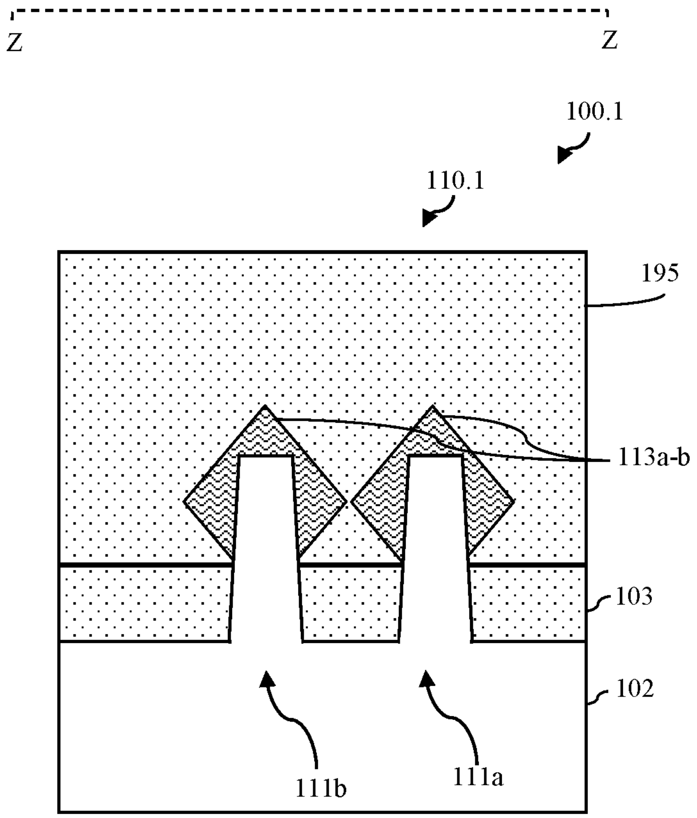

Gate 163 can be formed in gate opening 902 (e.g., see FIGS. 10A-10B). For example, a conformal gate dielectric layer 161 (including one or more layers of gate dielectric material) can be deposited so as to line gate opening 902. This conformal gate dielectric layer 161 can cover the top surfaces and sidewalls of exposed sections the semiconductor fins within gate opening 902, insulator layer 103 at the bottom of gate opening 902, and essentially vertical surfaces of first isolation structure 180*a* and, if applicable, second isolation structure 180*b* at the sides of gate opening 902. A gate conductor layer 162, including one or more layers of gate conductor material, can be deposited on gate dielectric layer 161 so as to fill any remaining space within gate opening 902. A polishing process (e.g., a CMP process) can be performed to remove gate material from above the MOL dielectric layer(s) 195, thereby forming gate 163. In some embodiments, gate 163 can be an RMG. Such an RMG can include, for example: a high-K gate dielectric layer; a work function metal layer on the high-K gate dielectric layer; an optional doped polysilicon gate conductor layer on the work function metal layer; and an optional metal silicide layer on the doped polysilicon gate conductor layer. After gate 163 is formed, it can be etched back within gate opening 902 (i.e., gate material can be removed from the upper portion of gate opening 902, leaving a recess). Dielectric gate cap material (e.g., SiN or some other suitable dielectric gate cap material) can be conformally deposited over the partially completed structure, filling the recess above gate 163. Another polishing process (e.g., a CMP process) can then be performed to remove the dielectric gate cap material from above MOL dielectric layer(s) 195, thereby forming a dielectric gate cap 165 on gate 163. The resulting dielectric gate cap 165 is positioned laterally immediately adjacent to first isolation structure 180*a* and, if applicable, positioned laterally between and immediately adjacent to both first isolation structure 180*a* and second isolation structure 180*b*, as illustrated.

Additional processing can include, but is not limited to, formation of one or more layers of ILD material over the FINFET, formation of contacts extending through the ILD material to FINFET components, formation of BEOL interconnects, etc. These features and techniques for forming them are well known in the art. Thus, the details thereof have been omitted from this specification in order to allow the reader to focus on the salient aspects of the disclosed embodiments.

It should be noted that in the structures and methods described above a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

It should further noted that in the structures and methods described above an RMG can include, for example: a high-K gate dielectric layer; a work function metal layer on the high-K gate dielectric layer; an optional doped polysilicon gate conductor layer on the work function metal layer; and an optional metal silicide layer on the doped polysilicon gate conductor layer. Various different RMG structures are known in the art and, thus, the details thereof have been omitted from this specification in order to allow the reader to focus on the salient aspects of the disclosed embodiments. However, those skilled in the art will recognize that the configuration of the gate stack for an RMG can vary depending upon whether the FET is an NFET or a PFET. For example, the optimal effective work function for the gate structure of an NFET is between about 3.9 eV and about 4.2 eV, whereas the optimal effective work function for the gate structure of a PFET is between about 4.9 eV and about 5.2 eV. In a gate-first polysilicon gate stack, the desired effective work function can be achieved, for example, by doping the polysilicon gate conductor layer with different dopants. For example, in an NFET, the polysilicon gate conductor layer can be doped with an N-type dopant (e.g., phosphorous (P), arsenic (As) or antimony (Sb)). In a PFET, the polysilicon gate conductor layer can be doped with P-type dopant (e.g., boron (B)). In a gate-first HKMG, the desired effective work function can be achieved, for example, using different metal layers on the high-K gate dielectric layer. For example, in an NFET, the metal layers on the high-K gate dielectric layer can include a titanium nitride (TiN) capping layer and, on the TiN capping layer, a lanthanum (La) layer for optimal NFET-specific dipole formation. In a PFET, the metal layers on the high-K gate dielectric layer can include a TiN capping layer and, on the TiN capping layer, an aluminum (Al) layer for optimal PFET-specific dipole formation. In an RMG, the desired effective work function can be achieved, for example, using different work function metal layers immediately adjacent to the high-K gate dielectric layer. Exemplary metals (and metal alloys), which have a work function within the range optimal for NFET performance (i.e., between 3.9 eV and about 4.2 eV) include, but are not limited to, hafnium, zirconium, titanium, tantalum, aluminum, and alloys thereof, such as, hafnium carbide, zirconium carbide, titanium carbide, tantalum carbide, and aluminum carbide. Exemplary metals (and metal alloys), which have a work function within the range optimal for PFET performance (i.e., between about 4.9 eV and about 5.2 eV) include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Such gate structures and the techniques for forming them are well known in the art and, thus, the details thereof have been omitted from this specification in order to allow the reader to focus on the salient aspects of the disclosed embodiments.

The method embodiments described above can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Additionally, in the structure and method embodiments described above, the terminology used is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a fin-type field effect transistor including:
a first semiconductor fin having a first top surface, a first inner sidewall, and a first outer sidewall opposite the first inner sidewall;
a second semiconductor fin parallel to the first semiconductor fin and having a second top surface, a second inner sidewall, and a second outer sidewall opposite the second inner sidewall;
a first isolation structure immediately adjacent to the first outer sidewall, wherein the first isolation structure extends vertically above a level of the first top surface; and
a gate immediately adjacent to the first inner sidewall opposite the first isolation structure and further extending over the first top surface to the first isolation structure,
wherein an interface between the gate and the first isolation structure is above and aligned vertically with the first outer sidewall,
wherein the first semiconductor fin has a first channel region positioned laterally between first source/drain regions,
wherein the first semiconductor fin has a first groove in the first outer sidewall at the first channel region,
wherein the first groove extends from the first top surface downward, so the first semiconductor fin is narrower at the first channel region than at the first source/drain regions, and
wherein the first isolation structure fills the first groove.

2. The structure of claim 1, wherein the gate and the first semiconductor fin have surfaces in contact with the first isolation structure.

3. The structure of claim 1, wherein, as measured at the first top surface and due to the first groove in the first outer sidewall at the first channel region, the first semiconductor fin is half as wide at the first channel region than at the first source/drain regions.

4. The structure of claim 1, wherein the second inner sidewall is physically separated from the first inner sidewall by a space, and wherein the gate further extends laterally across the space between the first semiconductor fin and the second semiconductor fin and is immediately adjacent to at least the second inner sidewall and the second top surface.

5. The structure of claim 4, further comprising a second isolation structure immediately adjacent to the second outer sidewall of the second semiconductor fin opposite the gate, wherein the second isolation structure extends vertically above a level of the second top surface, and wherein the gate further extends over the second top surface to the second isolation structure above the second outer sidewall.

6. The structure of claim 5, wherein the gate and the second semiconductor fin have surfaces in contact with the second isolation structure.

7. The structure of claim 5,
wherein the second semiconductor fin has a second channel region positioned laterally between second source/drain regions,
wherein the second semiconductor fin further has a second groove in the second outer sidewall at the second channel region,
wherein the second groove extends from the second top surface downward, so the second semiconductor fin is narrower at the second channel region than at the second source/drain regions, and
wherein the second isolation structure fills the second groove.

8. The structure of claim 7, wherein, as measured at the second top surface and due to the second groove in the second outer sidewall at the second channel region, the second semiconductor fin is half as wide at the second channel region than at the second source/drain regions.

9. The structure of claim 1, wherein the gate is further immediately adjacent the second inner sidewall, the second outer sidewall, and the second top surface.

10. The structure of claim 1, further comprising a gate sidewall spacer defining a gate opening,
wherein the gate and at least the first isolation structure are within the gate opening, and
wherein the gate includes:
a gate dielectric layer lining the gate opening; and
a gate conductor layer on the gate dielectric layer, wherein the gate dielectric layer is positioned laterally between the first isolation structure and the gate conductor layer.

11. The structure of claim 1, further comprising:
a semiconductor substrate, wherein the semiconductor fins extend essentially vertically from the semiconductor substrate; and
an insulator layer on the semiconductor substrate laterally surrounding lower portions of the first semiconductor fin and the second semiconductor fin, wherein upper portions of the first semiconductor fin and the second semiconductor fin extend above the insulator layer.

12. A structure comprising:
a fin-type field effect transistor including:
a first semiconductor fin having a first top surface, a first inner sidewall, and a first outer sidewall opposite the first inner sidewall;
a second semiconductor fin having a second top surface, a second inner sidewall, and a second outer sidewall opposite the second inner sidewall;
at least one additional semiconductor fin between and parallel to the first semiconductor fin and the second semiconductor fin, wherein each additional semiconductor fin has additional opposing sidewalls and an additional top surface;
a first isolation structure immediately adjacent to the first outer sidewall, wherein the first isolation structure extends vertically above a level of the first top surface; and
a gate immediately adjacent to the first inner sidewall of the first semiconductor fin opposite the first isolation structure and further extending over the first top surface of the first semiconductor fin to the first isolation structure,
wherein an interface between the gate and the first isolation structure is above and aligned vertically with the first outer sidewall,
wherein the first semiconductor fin has a first channel region positioned laterally between first source/drain regions,
wherein the first semiconductor fin has a first groove in the first outer sidewall at the first channel region,
wherein the first groove extends from the first top surface downward, so the first semiconductor fin is narrower at the first channel region than at the first source/drain regions,
wherein the first isolation structure fills the first groove, and wherein the gate is further immediately adjacent to the additional opposing sidewalls and the additional top surface of each additional semiconductor fin and immediately adjacent to at least the second inner sidewall of the second semiconductor fin.

13. The structure of claim 12, further comprising a second isolation structure immediately adjacent to the second outer sidewall opposite the gate, wherein the gate further extends over the second top surface to the second isolation structure.

14. The structure of claim 13, wherein the gate and the first semiconductor fin have surfaces in contact with the first isolation structure, and wherein the gate and the second semiconductor fin have surfaces in contact with the second isolation structure.

15. The structure of claim 14, wherein the second semiconductor fin has a second channel region positioned laterally between second source/drain regions, wherein the second semiconductor fin has a second groove in the second outer sidewall at the second channel region, wherein the second groove extends from the second top surface downward, so the second semiconductor fin is narrower at the second channel region than at the second source/drain regions, and wherein the second isolation structure fills the second groove.

16. A method comprising:

forming a fin-type field effect transistor including:

forming multiple semiconductor fins including: a first semiconductor fin having a first top surface, a first inner sidewall, and a first outer sidewall opposite the first inner sidewall; and a second semiconductor fin parallel to the first semiconductor fin and having a second top surface, a second inner sidewall, and a second outer sidewall opposite the second inner sidewall;

forming a first isolation structure immediately adjacent to the first outer sidewall, wherein the first isolation structure extends vertically above a level of the first top surface; and forming a gate immediately adjacent to the first inner sidewall opposite the first isolation structure and further extending over the first top surface to the first isolation structure, wherein an interface between the gate and the first isolation structure is above and aligned vertically with the first outer sidewall, wherein the first semiconductor fin has a first channel region positioned laterally between first source/drain regions, wherein the first semiconductor fin has a first groove in the first outer sidewall at the first channel region, wherein the first groove extends from the first top surface downward, so the first semiconductor fin is narrower at the first channel region than at the first source/drain regions, and wherein the first isolation structure fills the first groove.

17. The method of claim 16, further comprising, during the forming of the first isolation structure, forming a second isolation structure immediately adjacent to the second outer sidewall, wherein the second isolation structure extends vertically above a level of the second top surface and wherein the gate is further formed immediately adjacent to the second inner sidewall extending over the second top surface to the second isolation structure above the second outer sidewall.

18. The method of claim 17, further comprising, during the forming of the first isolation structure and the second isolation structure, concurrently forming grooves in the semiconductor fins including:

the first groove in the first outer sidewall at the first channel region of the first semiconductor fin, wherein the first groove extends from the first top surface downward at the first outer sidewall; and a second groove in the second outer sidewall at a second channel region of the second semiconductor fin, wherein the second groove extends from the second top surface downward at the second outer sidewall, wherein the first isolation structure fills the first groove, and the second isolation structure fills the second groove.

19. The method of claim 18, wherein, due to the first groove and the second groove, the first semiconductor fin is narrower in width at the first channel region than at first source/drain regions and the second semiconductor fin is narrower in width at the second channel region than at second source/drain regions.

* * * * *